(12) United States Patent
Chien

(10) Patent No.: US 11,521,974 B2
(45) Date of Patent: Dec. 6, 2022

(54) MEMORY DEVICE WITH DIFFERENT TYPES OF CAPACITORS AND METHOD FOR FORMING THE SAME

(71) Applicant: NANYA TECHNOLOGY CORPORATION, New Taipei (TW)

(72) Inventor: Jung-Hsing Chien, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/099,206

(22) Filed: Nov. 16, 2020

(65) Prior Publication Data

US 2022/0157821 A1 May 19, 2022

(51) Int. Cl.
*H01L 27/108* (2006.01)
*H01L 21/768* (2006.01)

(52) U.S. Cl.
CPC .... *H01L 27/10814* (2013.01); *H01L 21/7682* (2013.01); *H01L 27/10823* (2013.01); *H01L 27/10855* (2013.01); *H01L 27/10876* (2013.01); *H01L 27/10885* (2013.01)

(58) Field of Classification Search
None
See application file for complete search history.

(56) References Cited

U.S. PATENT DOCUMENTS

| | | | | |
|---|---|---|---|---|
| 2017/0133452 A1* | 5/2017 | Tu | | H01L 27/1052 |
| 2018/0301456 A1* | 10/2018 | Cho | | H01L 27/10876 |
| 2018/0342521 A1* | 11/2018 | Son | | H01L 21/76816 |
| 2019/0096890 A1* | 3/2019 | Lee | | H01L 27/10814 |
| 2020/0013668 A1* | 1/2020 | Choi | | H01L 21/76877 |
| 2020/0020697 A1* | 1/2020 | Kim | | H01L 21/76843 |
| 2020/0168611 A1 | 5/2020 | Jeon et al. | | |
| 2020/0373306 A1* | 11/2020 | Kim | | H01L 27/10823 |
| 2021/0126090 A1* | 4/2021 | Kim | | H01L 29/0649 |

FOREIGN PATENT DOCUMENTS

TW 202021042 A 6/2020

* cited by examiner

*Primary Examiner* — Steven M Christopher
(74) *Attorney, Agent, or Firm* — Muncy, Geissler, Olds & Lowe, P.C.

(57) ABSTRACT

A memory device includes a semiconductor substrate having a first active region and a second active region adjacent to the first active region. The memory device also includes a first word line extending across the first active region and the second active region. The memory device further includes a first source/drain region in the first active region and a second source/drain region in the second active region disposed at opposite sides of the first word line. In addition, the memory device includes a first capacitor disposed over and electrically connected to the first source/drain region in the first active region, and a second capacitor disposed over and electrically connected to the second source/drain region in the second active region. The first capacitor and the second capacitor have different sizes.

20 Claims, 24 Drawing Sheets

MEMORY DEVICE WITH DIFFERENT TYPES OF CAPACITORS AND METHOD FOR FORMING THE SAME

TECHNICAL FIELD

The present disclosure relates to a memory device and a method for forming the same, and more particularly, to a memory device with different types of capacitors and a method for forming the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have continuously shrunk so that the packing densities of these DRAMs have increased considerably. However, the manufacturing and integration of memory devices involve many complicated steps and operations. Integration in memory devices becomes increasingly complicated. An increase in complexity of manufacturing and integration of the memory device may cause deficiencies. Accordingly, there is a continuous need to improve the structure and the manufacturing process of memory devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a memory device structure is provided. The memory device includes a semiconductor substrate having a first active region and a second active region adjacent to the first active region. The memory device also includes a first word line extending across the first active region and the second active region. The memory device further includes a first source/drain region in the first active region and a second source/drain region in the second active region disposed at opposite sides of the first word line. In addition, the memory device includes a first capacitor disposed over and electrically connected to the first source/drain region in the first active region, and a second capacitor disposed over and electrically connected to the second source/drain region in the second active region. The first capacitor and the second capacitor have different sizes.

In an embodiment, the first capacitor and the second capacitor have different widths along a longitudinal axis of the first active region. In an embodiment, a first dielectric layer in the first capacitor and a second dielectric layer in the second capacitor are made of different materials. In an embodiment, the memory device further includes a third capacitor disposed above and electrically connected to a third source/drain region in the first active region, and a fourth capacitor disposed above and electrically connected to a fourth source/drain region in the second active region, wherein the third capacitor and the fourth capacitor have different sizes.

In an embodiment, the memory device further includes a first bit line disposed over and electrically connected to a fifth source/drain region in the first active region, and a second bit line disposed over and electrically connected to a sixth source/drain region in the second active region. In an embodiment, the first source/drain region in the first active region and the second source drain region in the second active region are disposed between the first bit line and the second bit line. In an embodiment, the memory device further includes a conductive contact disposed between the first capacitor and the first source/drain region, wherein the first bit line and the conductive contact have an air gap therebetween.

In another embodiment of the present disclosure, a memory device is provided. The memory device includes a semiconductor substrate having a first active region and a second active region adjacent to the first active region. The memory device also includes a first word line extending across the first active region and the second active region. The memory device further includes a first source/drain region in the first active region and a second source/drain region in the second active region disposed at opposite sides of the first word line. In addition, the memory device includes a first capacitor disposed over and electrically connected to the first source/drain region in the first active region, and a second capacitor disposed over and electrically connected to the second source/drain region in the second active region. The first capacitor and the second capacitor include different dielectric materials.

In an embodiment, the first capacitor includes a first dielectric layer sandwiched between a first conductive layer and a second conductive layer, the second capacitor includes a second dielectric layer sandwiched between a third conductive layer and a fourth conductive layer, and wherein the first dielectric layer and the second dielectric layer are made of different materials. In an embodiment, a footprint of the first capacitor is smaller than a footprint of the second capacitor. In an embodiment, the memory device further includes a third capacitor disposed over and electrically connected to a third source/drain region in the first active region, and a fourth capacitor disposed over and electrically connected to a fourth source/drain region in the second active region, wherein the third capacitor and the fourth capacitor include different dielectric materials. In an embodiment, a footprint of the third capacitor is smaller than a footprint of the fourth capacitor.

In an embodiment, the memory device further includes a second word line extending across the first active region but not across the second active region, and a third word line extending across the second active region but not across the first active region, wherein the first word line is disposed between the second word line and the third word line. In addition, the memory device includes a first bit line disposed above and electrically connected to a fifth source/drain region in the first active region between the first word line and the second word line, and a second bit line disposed above and electrically connected to a sixth source/drain region in the second active region between the first word line and the third word line. In an embodiment, the memory device further includes a dielectric layer disposed over the semiconductor substrate, wherein the first bit line and the second bit line are disposed in the dielectric layer, and the first bit line and the second bit line are separated from the dielectric layer by air gaps.

In yet another embodiment of the present disclosure, a memory device is provided. The memory device includes a semiconductor substrate having a first active region and a second active region adjacent to the first active region. The memory device also includes a first word line extending across the first active region and the second active region, and a second word line extending across the first active region but not across the second active region. The memory device further includes a first source/drain region disposed in the first active region, a second source/drain region disposed in the second active region, and a third source/drain region disposed in the first active region. The first source/drain region and the second source/drain region are disposed at opposite sides of the first word line, and the second source/drain region and the third source/drain region are disposed at opposite sides of the second word line. In addition, the memory device includes a first capacitor disposed over and electrically connected to the first source/drain region in the first active region, a second capacitor disposed over and electrically connected to the second source/drain region in the second active region, and a third capacitor disposed over and electrically connected to the third source/drain region in the first active region. A size of the first capacitor is substantially the same as a size of the third capacitor, and the size of the first capacitor is different from a size of the second capacitor.

In an embodiment, a bottom surface of the second capacitor is greater than a bottom surface of the first capacitor. In an embodiment, the first capacitor includes a first dielectric layer sandwiched between a first conductive layer and a second conductive layer, the second capacitor includes a second dielectric layer sandwiched between a third conductive layer and a fourth conductive layer, and wherein the first dielectric layer and the second dielectric layer are made of different materials. In an embodiment, the third capacitor includes a third dielectric layer sandwiched between a fifth conductive layer and a sixth conductive layer, wherein the third dielectric layer is made of a same material as the first dielectric layer of the first capacitor.

In an embodiment, the memory device further includes a third word line extending across the second active region but not across the first active region, and a fourth source/drain region disposed in the second active region, wherein the first source/drain region and the fourth source/drain region are disposed at opposite sides of the third word line. In addition, the memory device includes a fourth capacitor disposed over and electrically connected to the fourth source/drain region in the second active region, wherein a size of the fourth capacitor is substantially the same as the size of the second capacitor. In an embodiment, the memory device further includes a fifth source/drain region disposed in the first active region and between the first word line and the second word line, and a sixth source/drain region disposed in the second active region and between the first word line and the third word line. In addition, the memory device includes a first bit line electrically connected to the fifth source/drain region, and a second bit line electrically connected to the sixth source/drain region.

Embodiments of a memory device and method for forming the same are provided in the disclosure. In some embodiments, the memory device includes a first capacitor and a second capacitor disposed over and electrically connected to source/drain regions in different active regions. Since the first capacitor and the second capacitor have different sizes and/or different dielectric materials, multiple levels of storage capacities may be obtained. As a result, the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
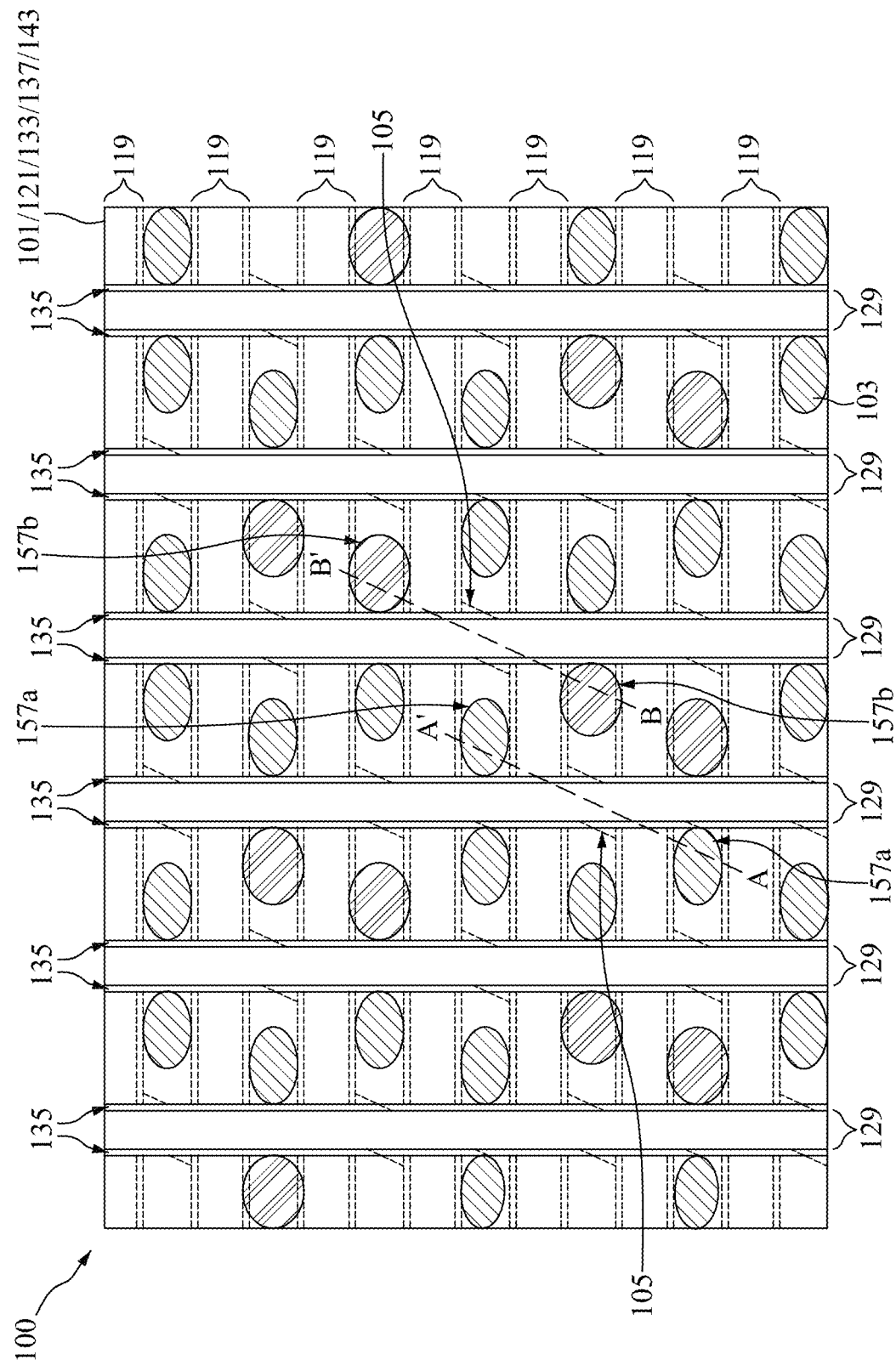
FIG. 1 is a top view illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
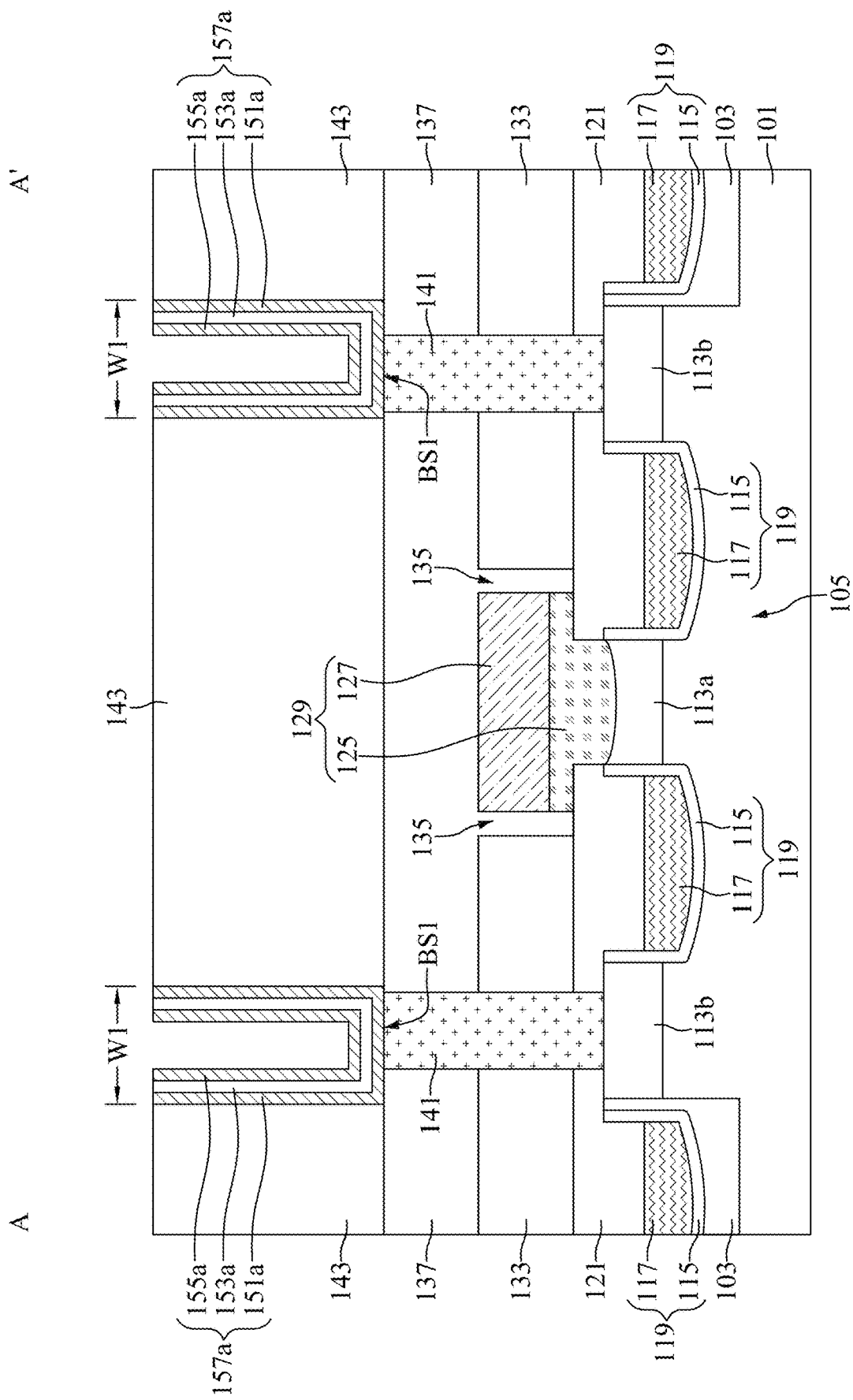
FIG. 2 is a cross-sectional view illustrating the memory device along the sectional line A-A' in FIG. 1, in accordance with some embodiments.
Figure 3:
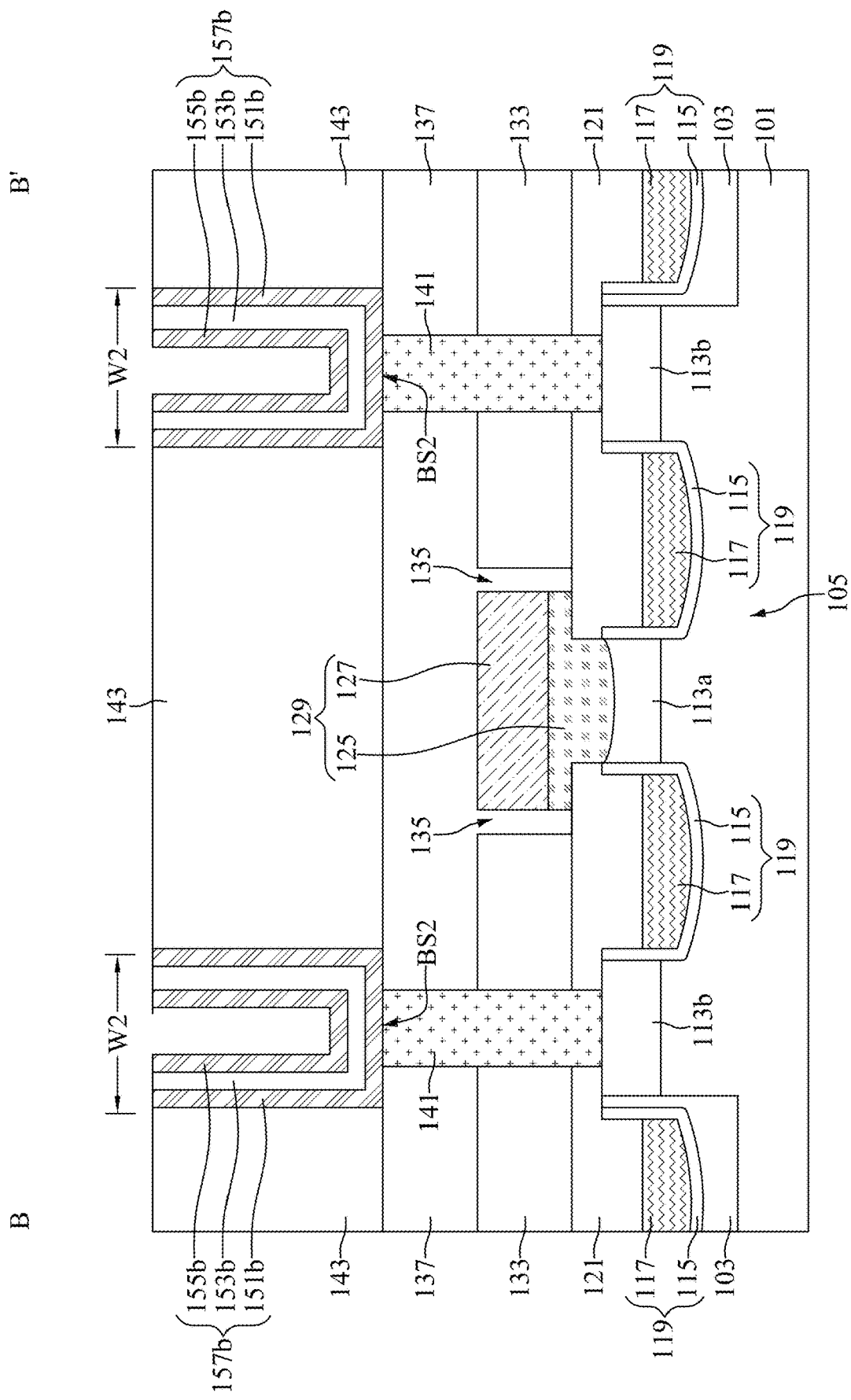
FIG. 3 is a cross-sectional view illustrating the memory device along the sectional line B-B' in FIG. 1, in accordance with some embodiments.

FIG. 1 is a top view illustrating a memory device 100, FIG. 2 is a cross-sectional view illustrating the memory device 100 along the sectional line A-A' in FIG. 1, and FIG. 3 is a cross-sectional view illustrating the memory device 100 along the sectional line B-B' in FIG. 1, in accordance with some embodiments.

As shown in FIGS. 1 to 3, the memory device 100 includes a semiconductor substrate 101, an isolation structure 103 disposed in the semiconductor substrate 101 defining a plurality of active regions 105, a plurality of word lines 119 (i.e., the gate structures) extending across the active regions 105, and a plurality of source/drain regions 113a and 113b in the active regions 105 separated by the word lines 119. In some embodiments, each of the active regions 105 includes two source/drain regions 113b and one source/drain region 113a disposed between the source/drain regions 113b. Moreover, each of the word lines 119 includes a gate dielectric layer 115 and a gate electrode 117 surrounded by the gate dielectric layer 115.

The memory device 100 also includes a dielectric cap layer 121 covering the word lines 119, a dielectric layer 133 disposed over the dielectric cap layer 121, and a plurality of bit lines 129 penetrating through the dielectric layer 133 and the dielectric cap layer 121 to electrically connect to the source/drain regions 113a. In some embodiments, each of the bit line 129 includes a lower bit line layer 125 and an upper bit line layer disposed over the lower bit line layer 125. In some embodiments, the bit lines 129 are separated from the dielectric layer 133 by air gaps 135.

The memory device 100 further includes a dielectric layer 137 disposed over the dielectric layer 133, a plurality of conductive contacts 141 penetrating through the dielectric cap layer 121 and the dielectric layers 133 and 137 to electrically connect to the source/drain regions 113b, and a dielectric layer 143 disposed over the dielectric layer 137. In addition, the memory device 100 includes a first group of capacitors 157a and a second group of capacitors 157b disposed in the dielectric layer 143 to electrically connect to the source/drain regions 113b through the conductive contacts 141, as shown in FIGS. 1 to 3 in accordance with some embodiments.

In some embodiments, the sizes of the capacitors 157a are substantially the same, and the sizes of the capacitors 157b are substantially the same. Within the context of this disclosure, the word "substantially" means preferably at least 90%, more preferably 95%, even more preferably 98%, and most preferably 99%. In some embodiments, the first group of capacitors 157a and the second group of capacitors 157b have different sizes. In particular, the first group of capacitors 157a have footprints smaller than the second group of capacitors 157b. Each of the capacitors 157a has a width W1 along the longitudinal axis of the active regions 105 as shown in FIG. 2, and each of the capacitors 157b has a width W2 along the longitudinal axis of the active regions 105 as shown in FIG. 3 in accordance with some embodiments. In some embodiments, the width W2 is greater than the width W1. In addition, the bottom surfaces BS2 of the capacitors 157b are greater than the bottom surfaces BS1 of the capacitors 157a.

Specifically, each of the capacitors 157a includes a conductive layer 151a, a dielectric layer 153a disposed over the conductive layer 151a, and a conductive layer 155a disposed over the dielectric layer 153a, as shown in FIG. 2 in accordance with some embodiments. In some embodiments, the conductive layers 155a are surrounded by the dielectric layers 153a, and the dielectric layers 153a are surrounded by the conductive layers 151a. In some embodiments, the dielectric layers 153a are sandwiched between the conductive layers 151a and 155a.

Moreover, each of the capacitors 157b includes a conductive layer 151b, a dielectric layer 153b disposed over the conductive layer 151b, and a conductive layer 155b disposed over the dielectric layer 153b, as shown in FIG. 3 in accordance with some embodiments. In some embodiments, the conductive layers 155b are surrounded by the dielectric layers 153b, and the dielectric layers 153b are surrounded by the conductive layers 151b. In some embodiments, the dielectric layers 153b are sandwiched between the conductive layers 151b and 155b.

In some embodiments, the dielectric layers 153a of the first group of capacitors 157a are made of a first material, the dielectric layers 153b of the second group of capacitors 157b are made of a second material, and the first material is different from the second material. For example, the dielectric layers 153a of the first group of capacitors 157a are made of silicon dioxide ($SiO_2$), and the dielectric layers 153b of the second group of capacitors 157b are made of hafnium dioxide ($HfO_2$). In some embodiments, the memory device 100 is a dynamic random access memory (DRAM). Since the sizes of the first group of capacitors 157a are different from the sizes of the second group of capacitors 157b, multiple levels of storage capacities may be obtained. As a result, the overall device performance may be improved.

Figure 4:
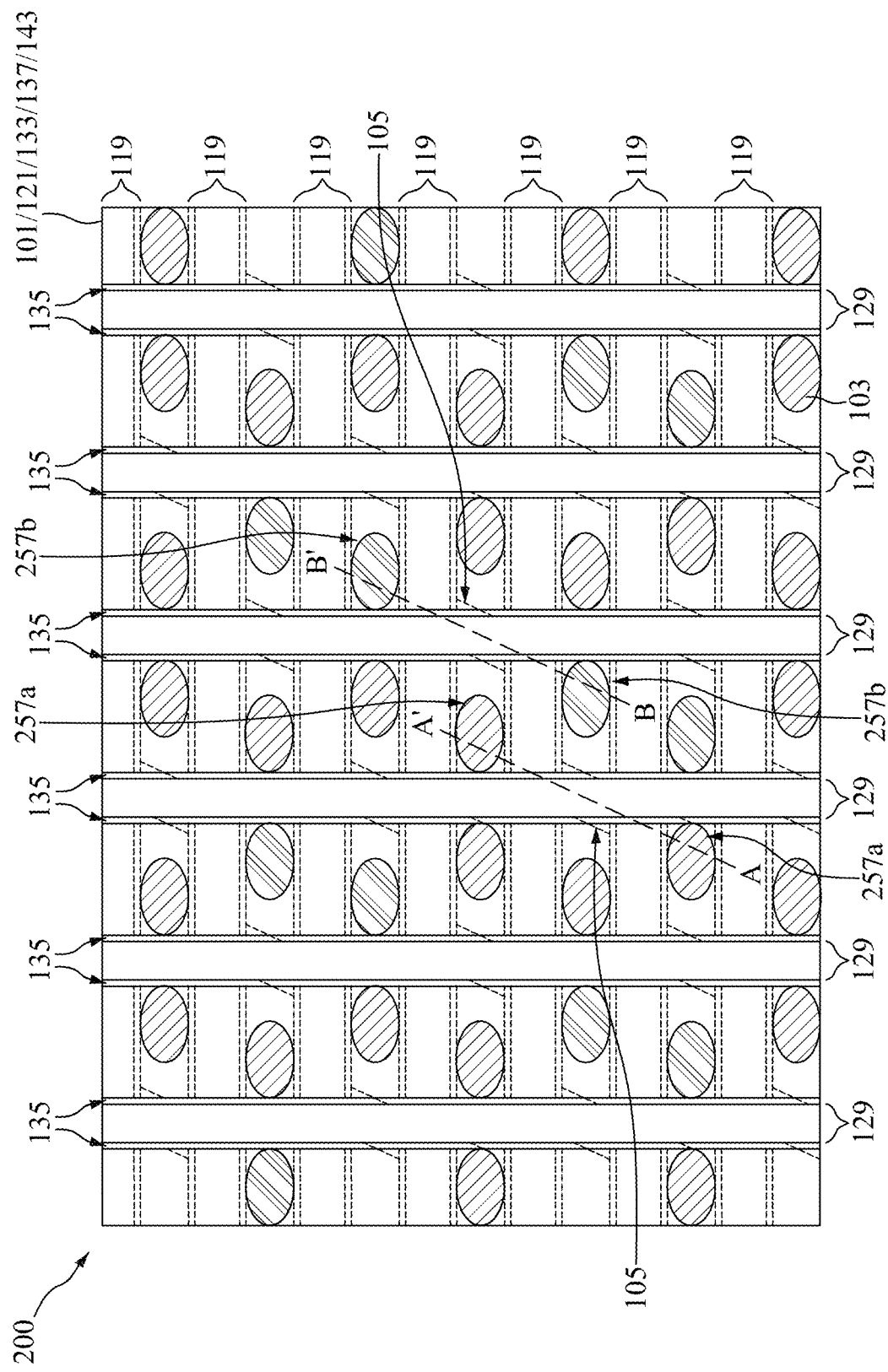
FIG. 4 is a top view illustrating a modified memory device, in accordance with some embodiments.
Figure 5:
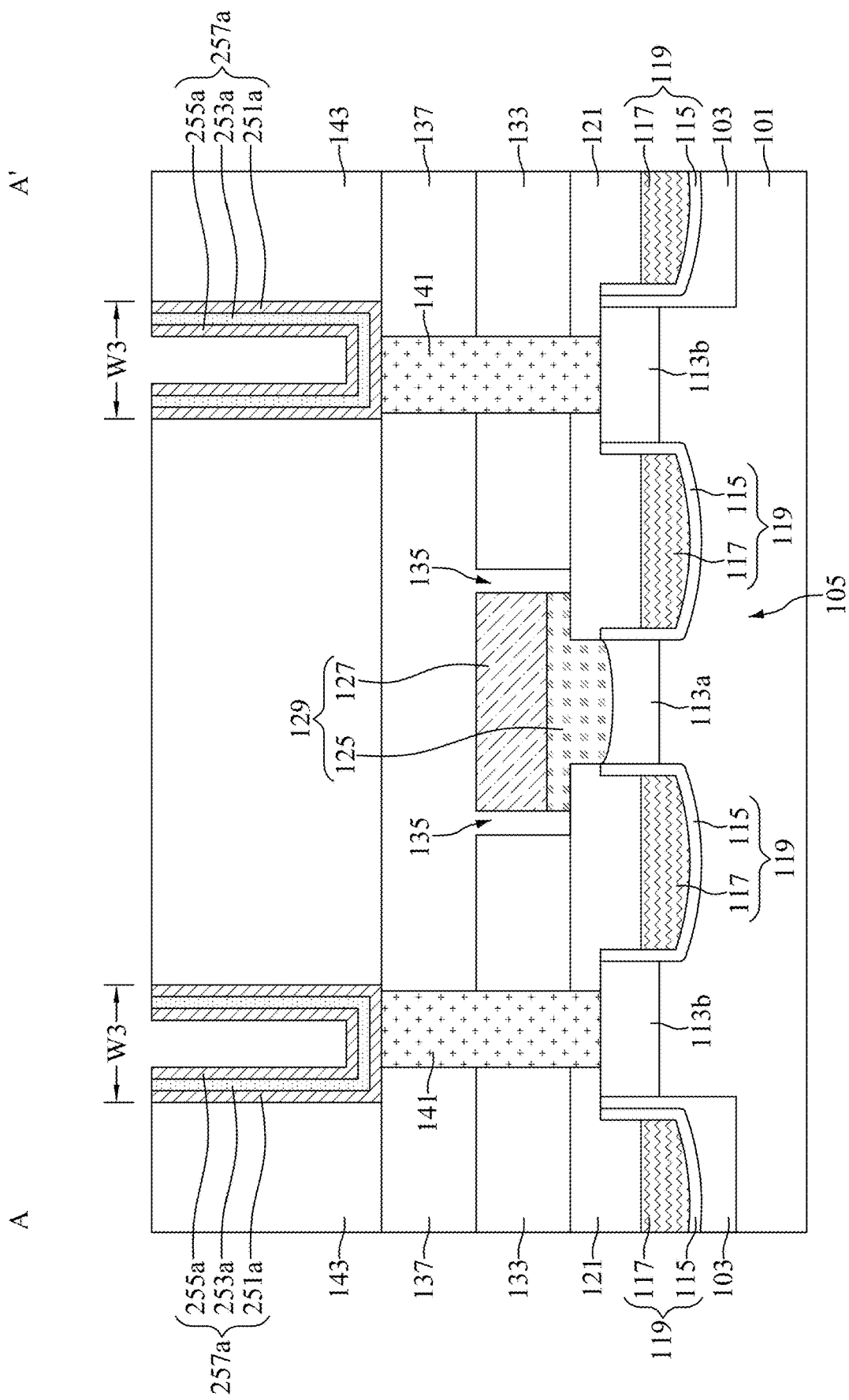
FIG. 5 is a cross-sectional view illustrating the modified memory device along the sectional line A-A' in FIG. 4, in accordance with some embodiments.
Figure 6:
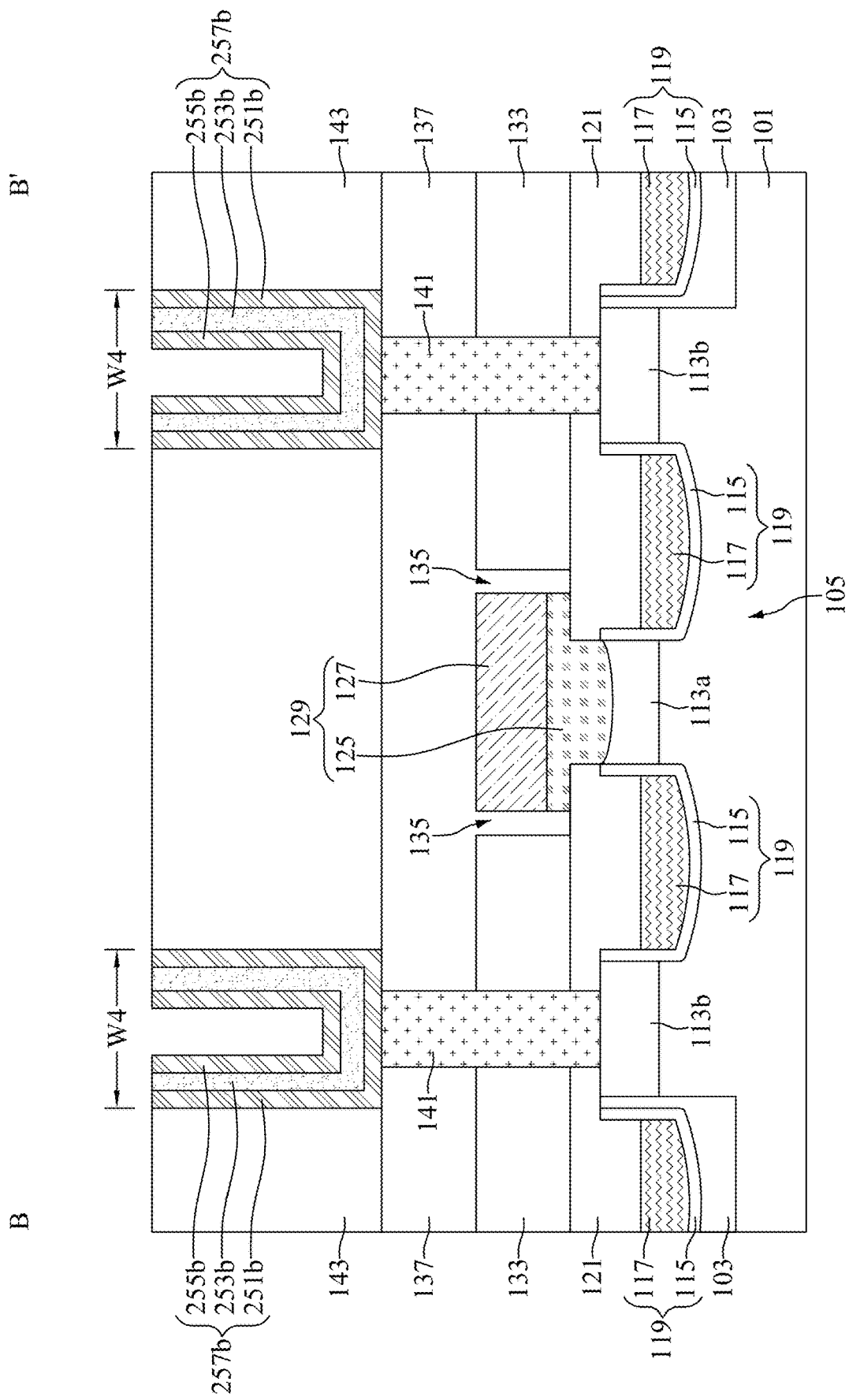
FIG. 6 is a cross-sectional view illustrating the modified memory device along the sectional line B-B' in FIG. 4, in accordance with some embodiments.

FIG. 4 is a top view illustrating a modified memory device 200, FIG. 5 is a cross-sectional view illustrating the modified memory device 200 along the sectional line A-A' in FIG. 4, and FIG. 6 is a cross-sectional view illustrating the modified memory device 200 along the sectional line B-B' in FIG. 4, in accordance with some embodiments. For reasons of consistency and clarity, similar components appearing in FIGS. 1 to 6 will be labeled the same.

Similar to the memory device 100, the modified memory device 200 includes a first group of capacitors 257a and a second group of capacitors 257b disposed in the dielectric layer 143 to electrically connect to the source/drain regions 113b through the conductive contacts 141, as shown in FIGS. 4 to 6 in accordance with some embodiments. However, the sizes of the capacitors 257a and the sizes of the capacitors 257b are substantially the same. Each of the capacitors 257a has a width W3 along the longitudinal axis of the active regions 105 as shown in FIG. 5, and each of the capacitors 257b has a width W4 along the longitudinal axis of the active regions 105 as shown in FIG. 6 in accordance with some embodiments. In some embodiments, the width W3 is substantially the same as the width W4.

Specifically, each of the capacitors 257a includes a conductive layer 251a, a dielectric layer 253a disposed over the conductive layer 251a, and a conductive layer 255a disposed over the dielectric layer 253a, as shown in FIG. 5 in accordance with some embodiments. In some embodiments, the conductive layers 255a are surrounded by the dielectric layers 253a, and the dielectric layers 253a are surrounded by the conductive layers 251a. In some embodiments, the dielectric layers 253a are sandwiched between the dielectric layers 251a and 255a.

Moreover, each of the capacitors 257b includes a conductive layer 251b, a dielectric layer 253b disposed over the conductive layer 251b, and a conductive layer 255b disposed over the dielectric layer 253b, as shown in FIG. 6 in accordance with some embodiments. In some embodiments, the conductive layers 255b are surrounded by the dielectric layers 253b, and the dielectric layers 253b are surrounded by the conductive layers 251b. In some embodiments, the dielectric layers 253b are sandwiched between the dielectric layers 251b and 255b.

In some embodiments, the dielectric layers 253a of the first group of capacitors 257a are made of a first material, the dielectric layers 253b of the second group of capacitors 257b are made of a second material, and the first material is different from the second material. For example, the dielectric layers 253a of the first group of capacitors 257a are made of silicon dioxide ($SiO_2$), and the dielectric layers 253b of the second group of capacitors 257b are made of hafnium dioxide ($HfO_2$). In some embodiments, the memory device 200 is a dynamic random access memory (DRAM). Since the first group of capacitors 257a and the second group of capacitors 257b include different dielectric materials, multiple levels of storage capacities may be obtained. As a result, the overall device performance may be improved.

Figure 7:
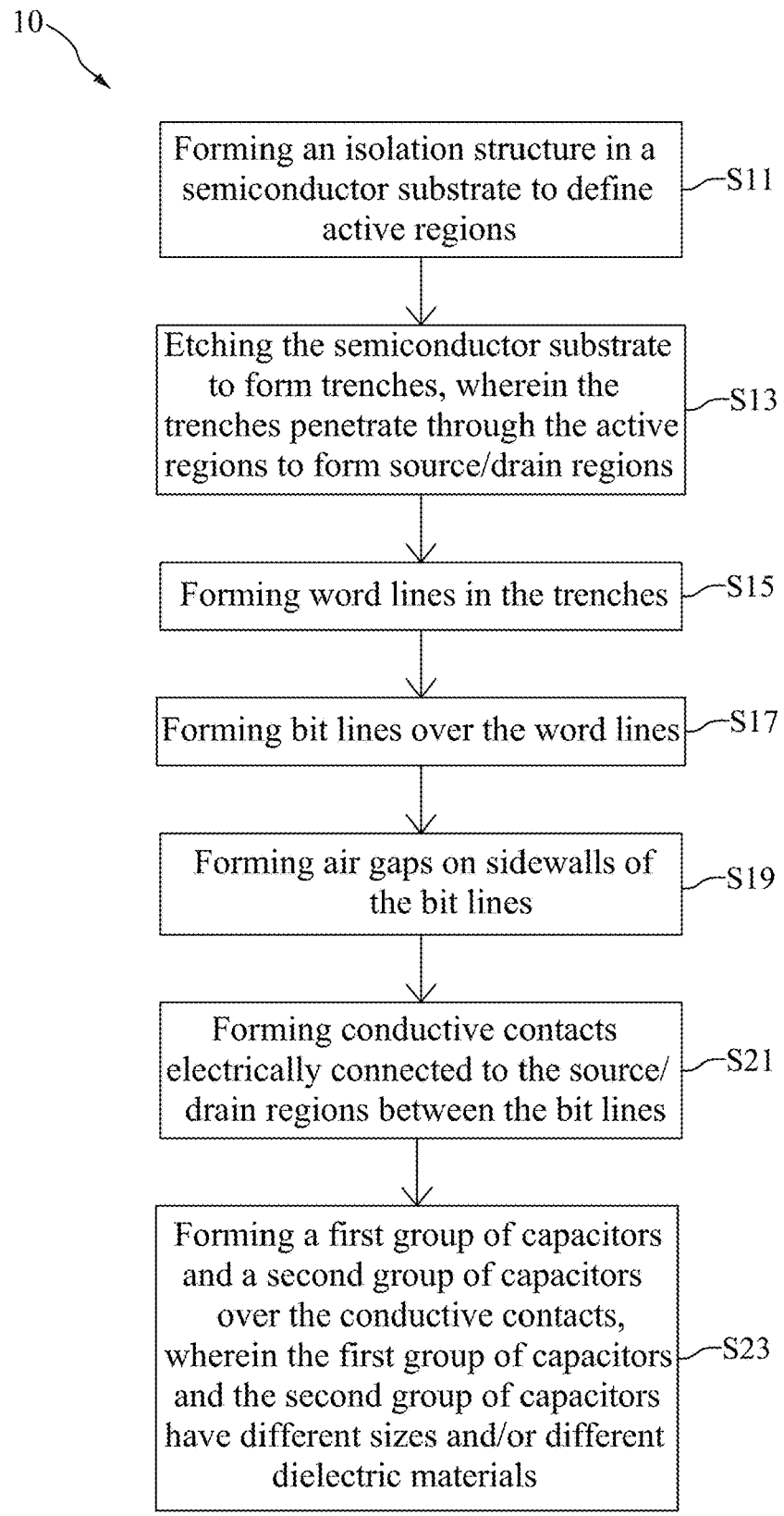
FIG. 7 is a flow diagram illustrating a method for forming a memory device, in accordance with some embodiments.

FIG. 7 is a flow diagram illustrating a method 10 for forming a memory device (including the memory devices 100 and 200), and the method 10 includes steps S11, S13, S15, S17, S19, S21 and S23, in accordance with some embodiments. The steps S11 to S23 of FIG. 7 are elaborated in connection with the following figures.

Figure 22:
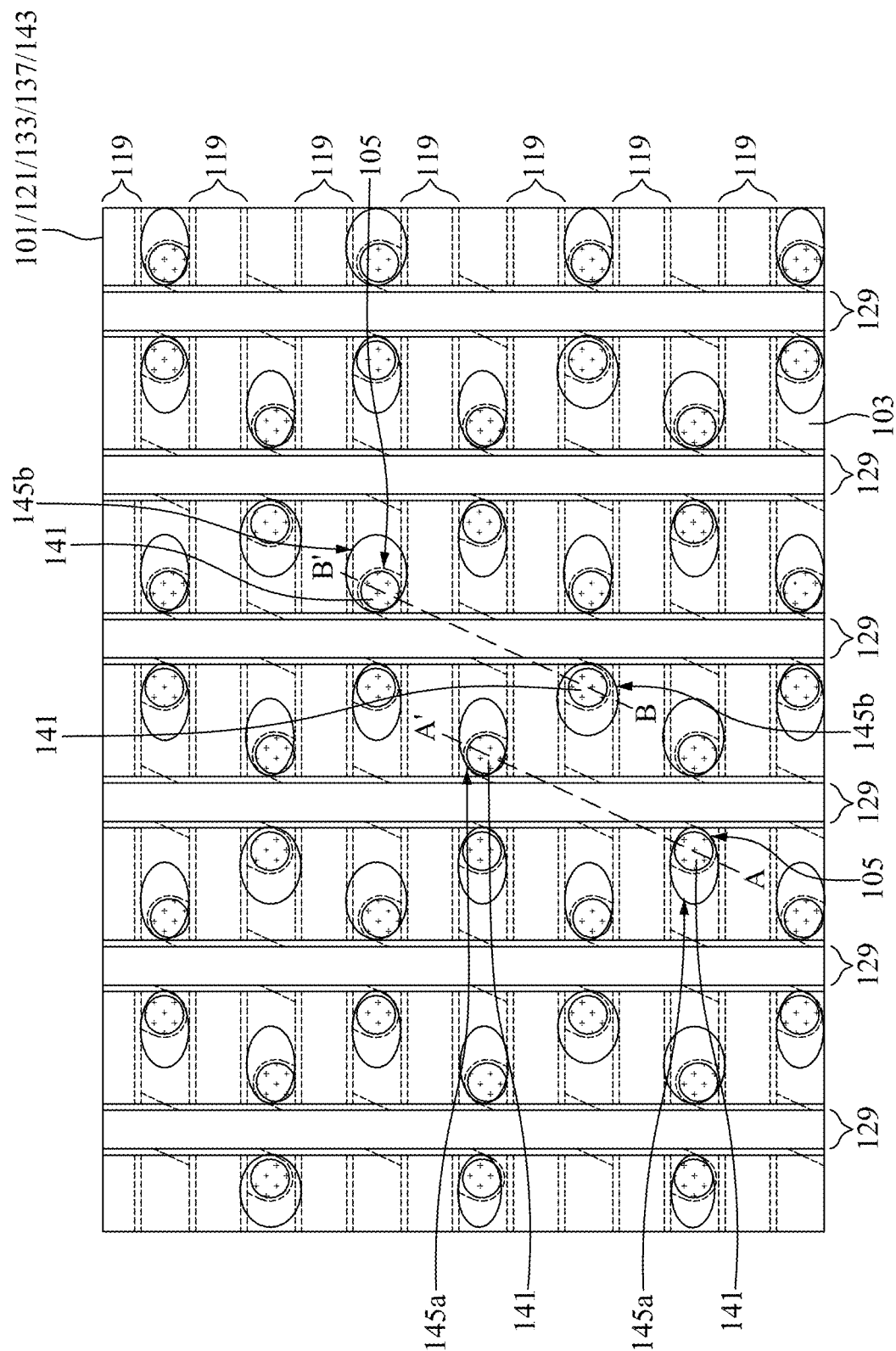
FIG. 22 is a top view illustrating an intermediate stage of forming conductive contacts in the dielectric layer during the formation of the memory device, in accordance with some embodiments.
Figure 23:
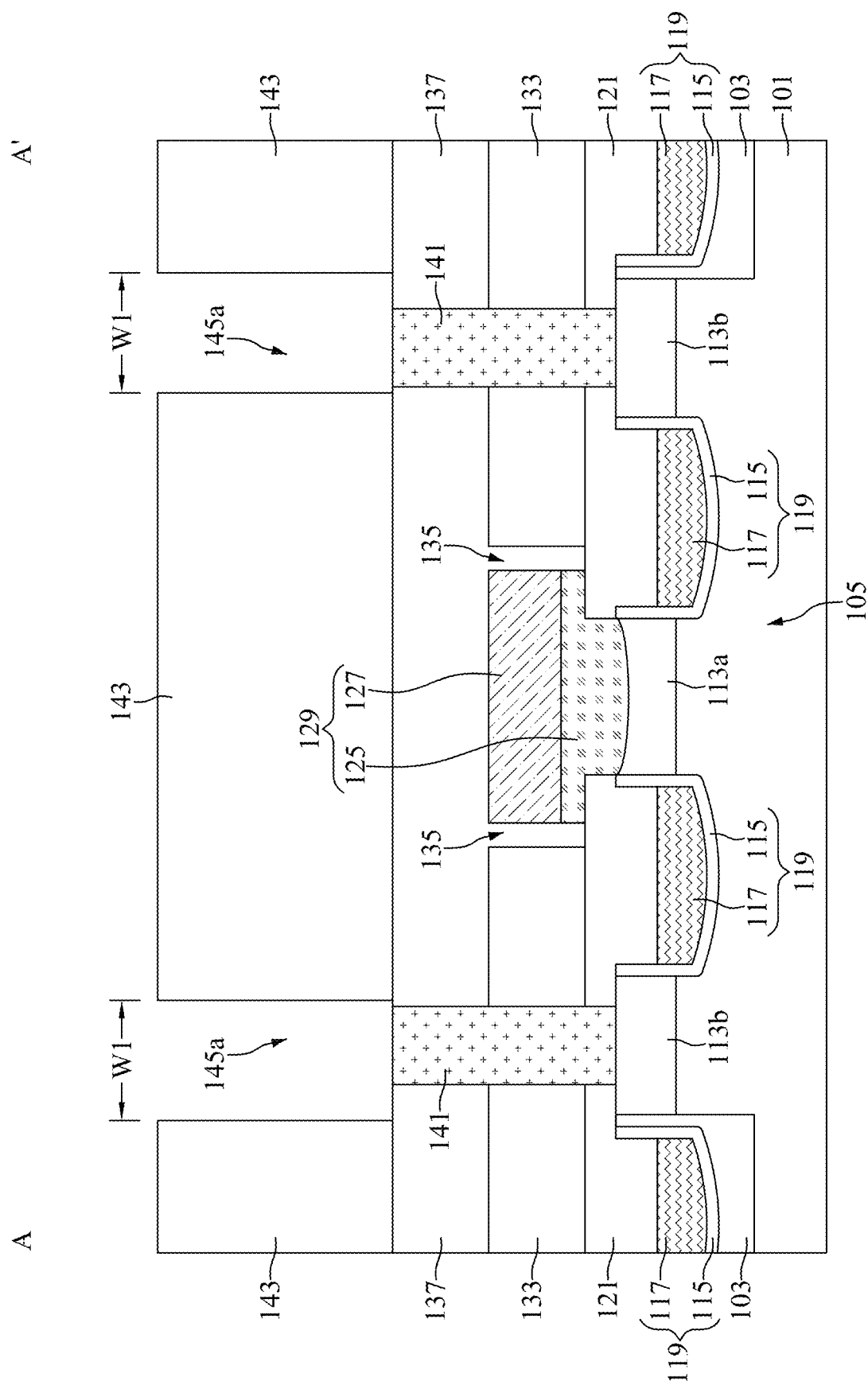
FIG. 23 is a cross-sectional view illustrating an intermediate stage in the formation of the memory device along the sectional line A-A' in FIG. 22, in accordance with some embodiments.
Figure 24:
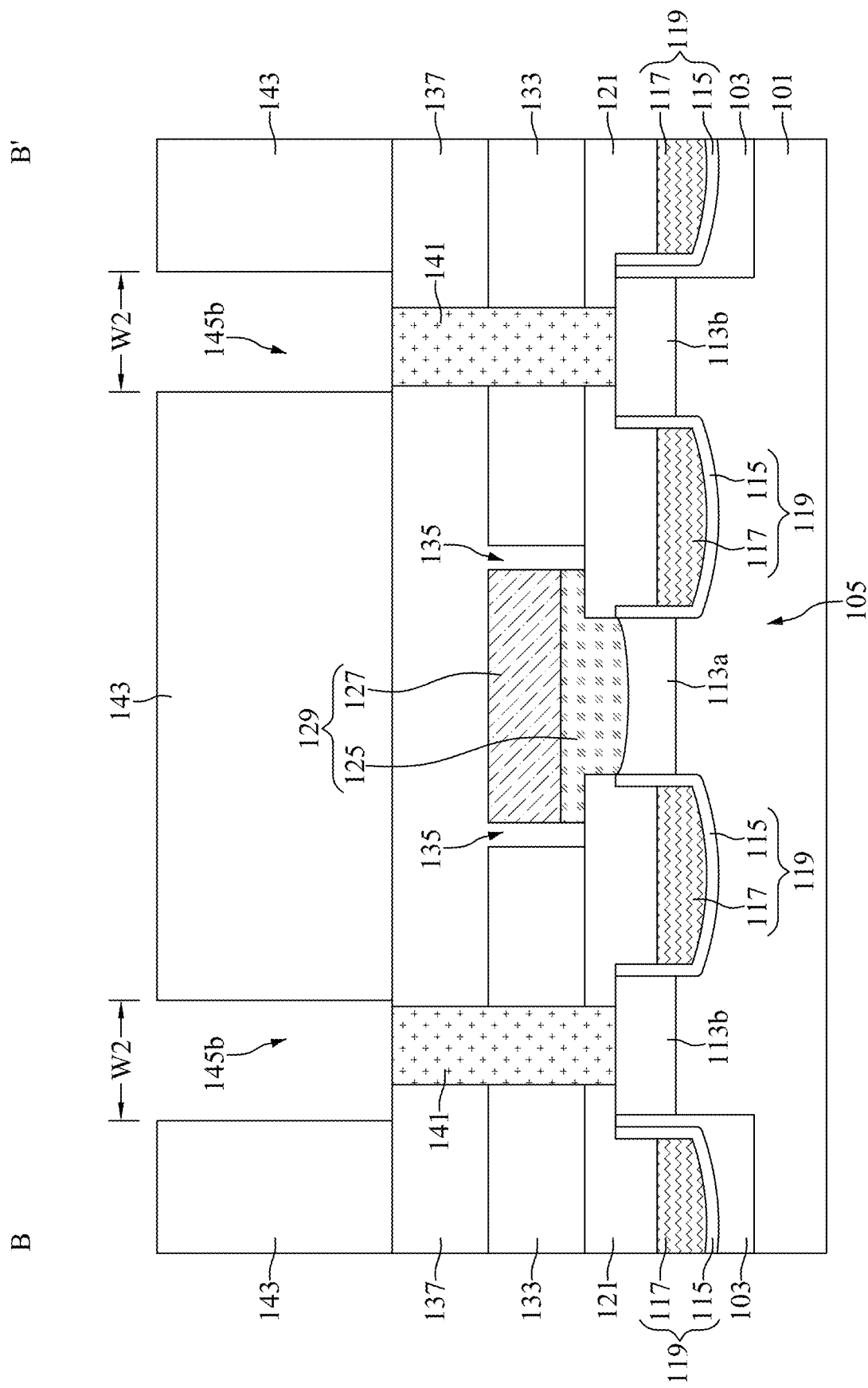
FIG. 24 is a cross-sectional view illustrating an intermediate stage in the formation of the memory device along the sectional line B-B' in FIG. 22, in accordance with some embodiments.

FIGS. 8, 10, 12, 14, 16, 18, 20 and 22 are top views illustrating intermediate stages in the formation of the memory device 100, and FIGS. 9, 11, 13, 15, 17, 19, 21, 23 and 24 are cross-sectional views illustrating intermediate stages in the formation of the memory device 100, in accordance with some embodiments. It should be noted that FIGS. 9, 11, 13, 15, 17, 19, 21 and 23 are cross-sectional views along the sectional line A-A' of FIGS. 8, 10, 12, 14, 16, 18, 20 and 22, respectively, and FIG. 24 is a cross-sectional view along the sectional line B-B' of FIG. 22.

Figure 8:
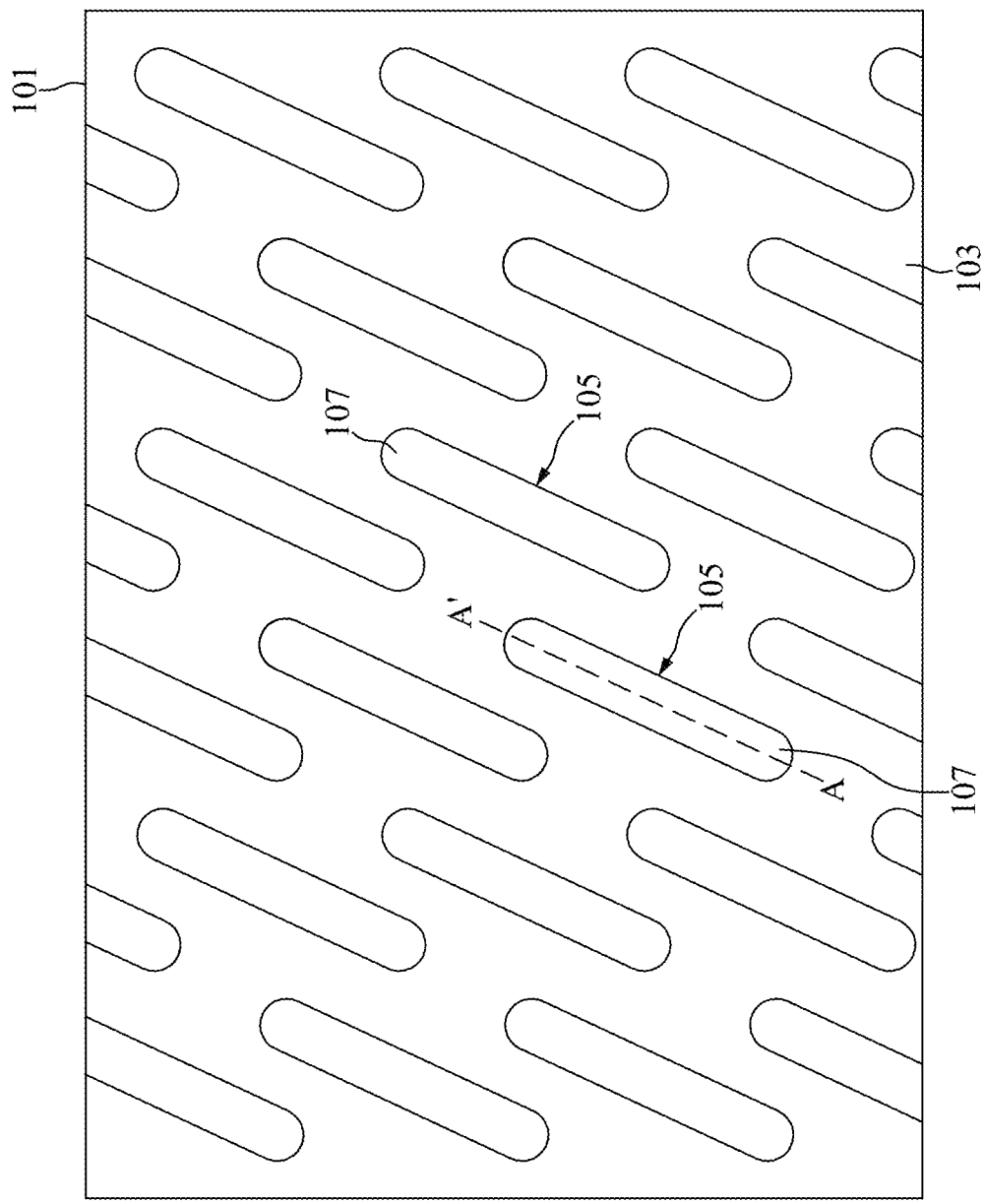
FIG. 8 is a top view illustrating an intermediate stage of forming active regions in a semiconductor substrate during the formation of the memory device, in accordance with some embodiments.
Figure 9:
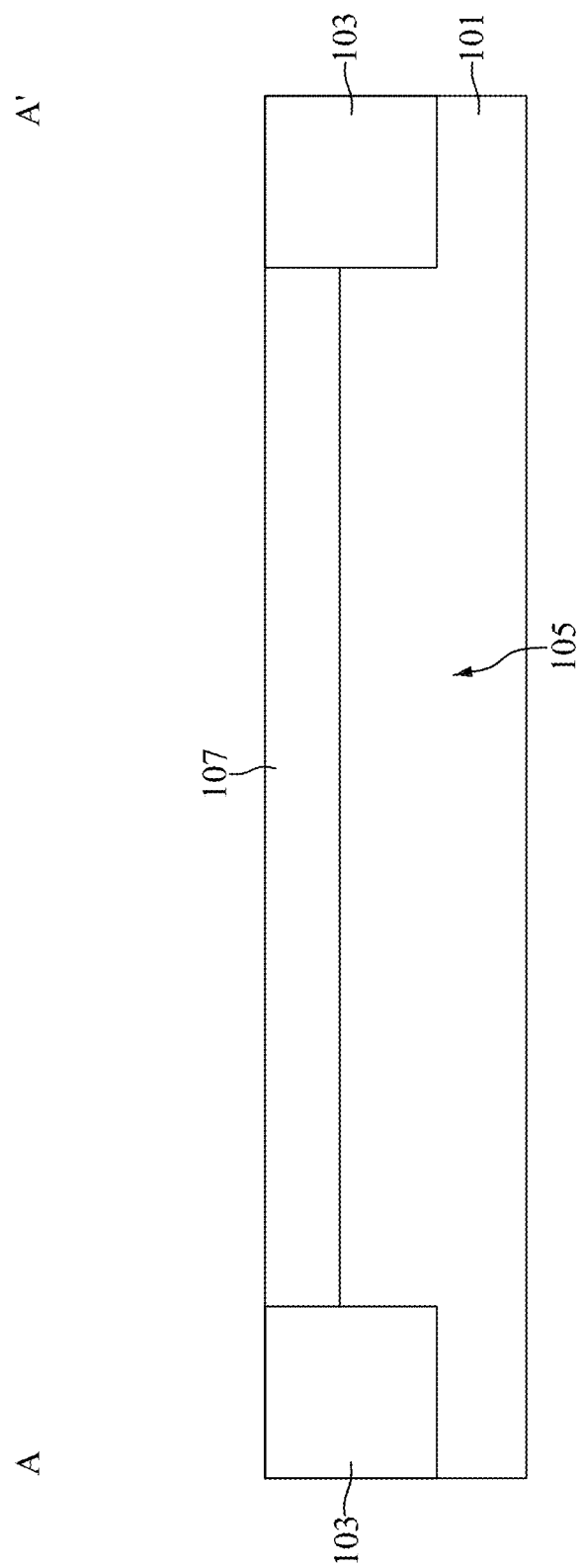
FIG. 9 is a cross-sectional view illustrating an intermediate stage in the formation of the memory device along the sectional line A-A' in FIG. 8, in accordance with some embodiments.

As shown in FIGS. 8 and 9, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIGS. 8 and 9, the isolation structure 103 is formed in the semiconductor substrate 101 to define the active regions 105, and the isolation structure 103 is a shallow trench isolation (STI) structure, in accordance with some embodiments. The respective step is illustrated as the step S11 in the method 10 shown in FIG. 7. In addition, the isolation structure 103 may be made of silicon oxide, silicon nitride, silicon oxynitride or another applicable dielectric material, and the formation of the isolation structure 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and polishing the dielectric material until the semiconductor substrate 101 is exposed.

Moreover, doped regions 107 are formed in the active regions 105 defined by the isolation structure 103. In some embodiments, the doped regions 107 are formed by one or more ion implantation processes, and P-type dopants, such as boron (B), gallium (Ga), or indium (In), or N-type dopants, such as phosphorous (P) or arsenic (As), can be implanted in the active regions 105 to form the doped regions 107, depending on the conductivity type of the memory device 100. In addition, the doped regions 107 will become the source/drain regions of the memory device 100 in the subsequent processes.

Figure 10:
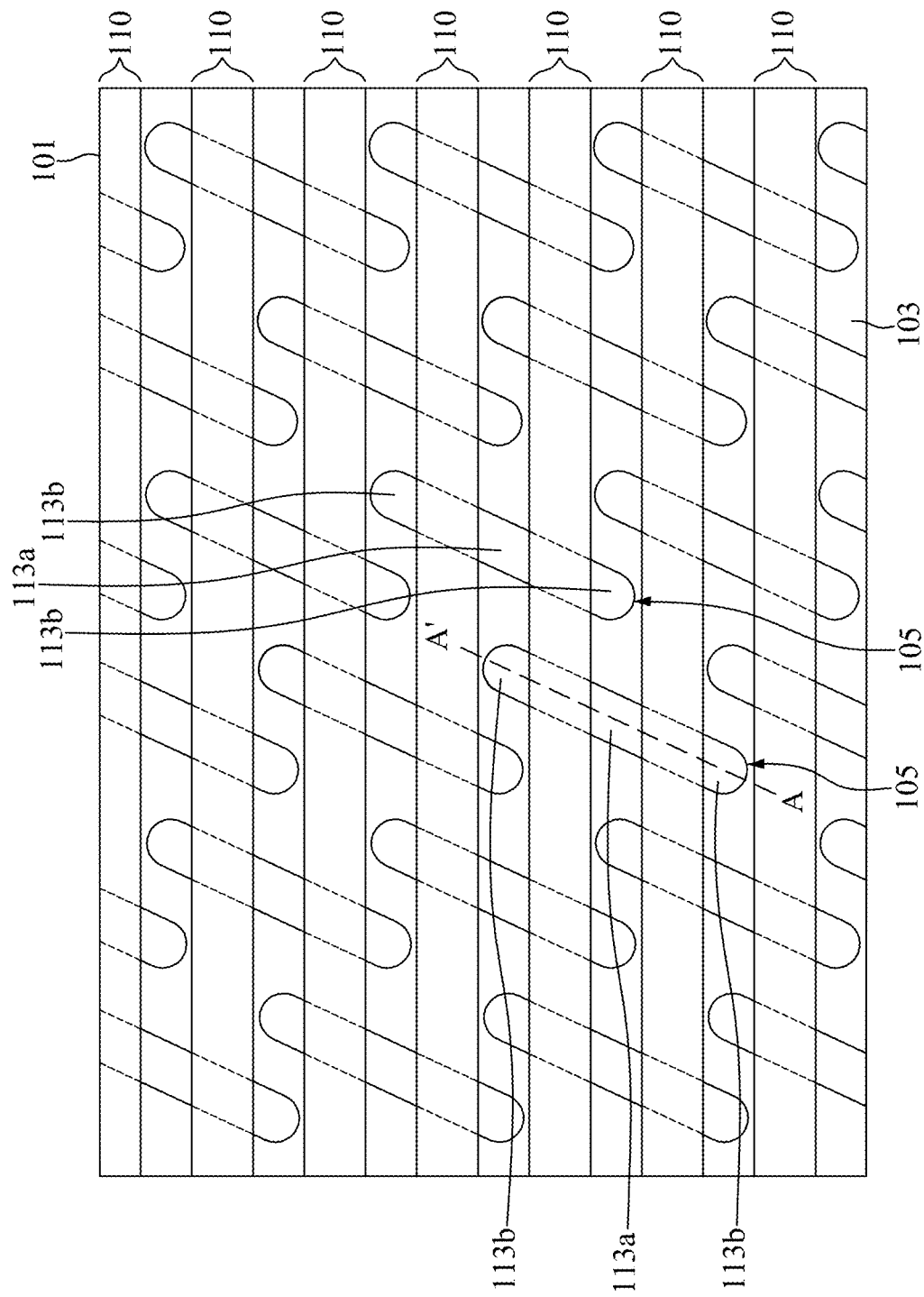
FIG. 10 is a top view illustrating an intermediate stage of forming trenches across the active regions during the formation of the memory device, in accordance with some embodiments.
Figure 11:
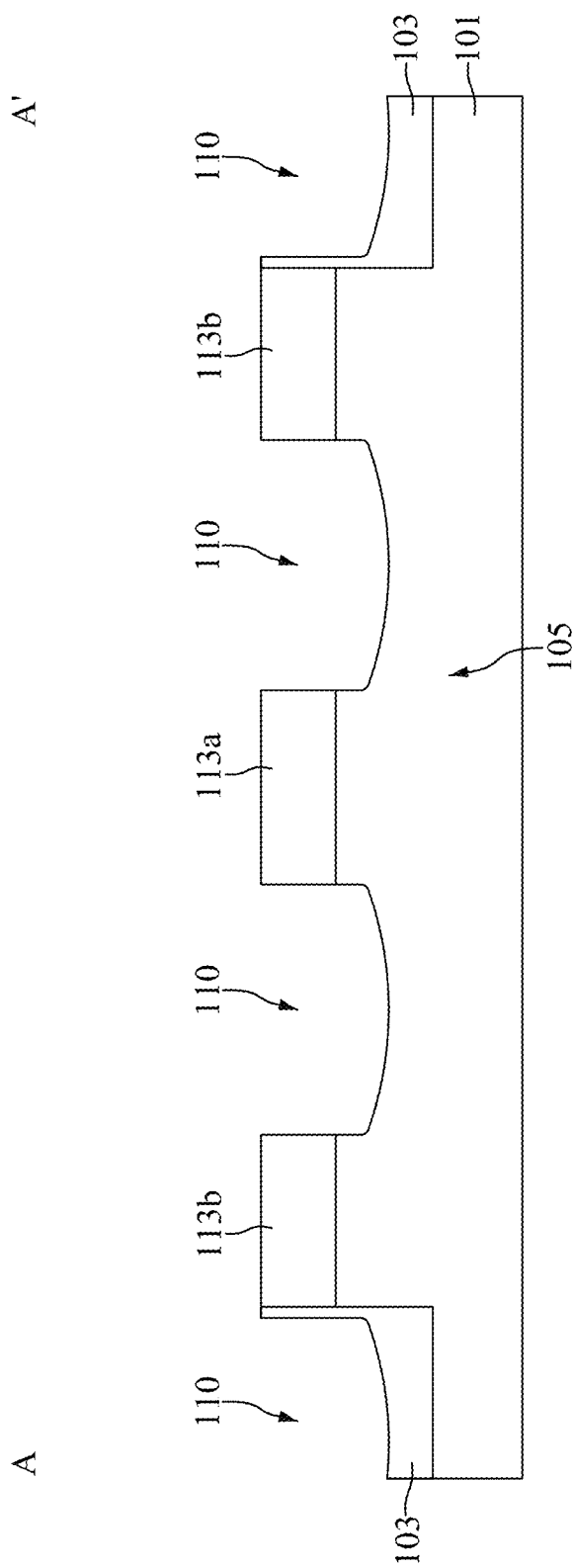
FIG. 11 is a cross-sectional view illustrating an intermediate stage in the formation of the memory device along the sectional line A-A' in FIG. 10, in accordance with some embodiments.

After the doped regions 107 are formed, the semiconductor substrate 101 is etched to form a plurality of trenches 110, as shown in FIGS. 10 and 11 in accordance with some embodiments. In some embodiments, the trenches 110 are parallel to each other. In some embodiments, the trenches 110 extending across the doped regions 107 in the active regions 105 to form the source/drain regions 113a and 113b. The respective step is illustrated as the step S13 in the method 10 shown in FIG. 7.

In some embodiments, the source/drain regions 113b are located at the opposite end portions of the active regions 105, and the source/drain regions 113a are located at the middle portions of the active regions 105. The formation of the trenches 110 may include forming a patterned mask (not shown) over the semiconductor substrate 101, and etching the semiconductor substrate 101 by using the patterned mask as a mask. After the trenches 110 are formed, the pattered mask may be removed.

Figure 12:
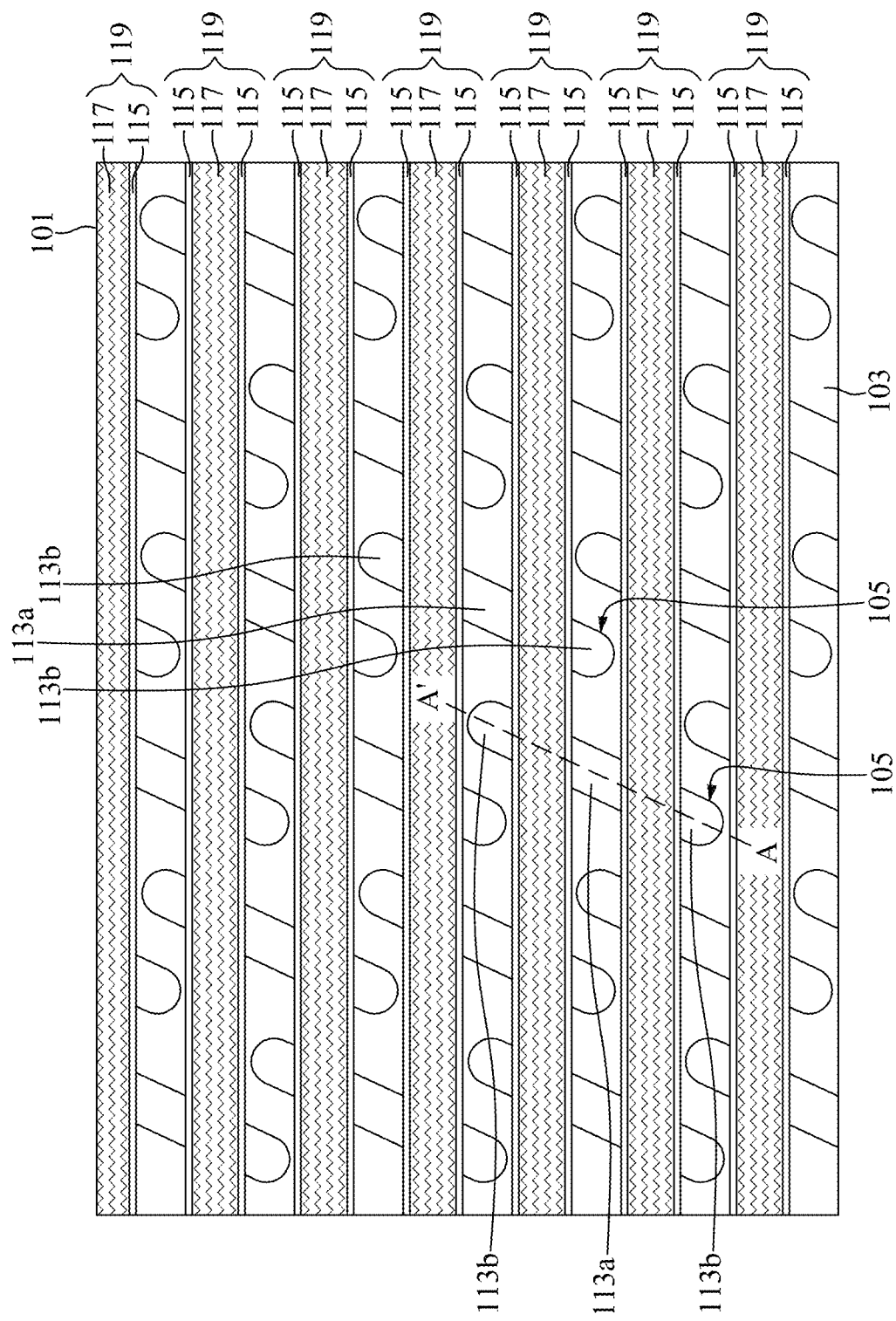
FIG. 12 is a top view illustrating an intermediate stage of forming word lines in the trenches during the formation of the memory device, in accordance with some embodiments.
Figure 13:
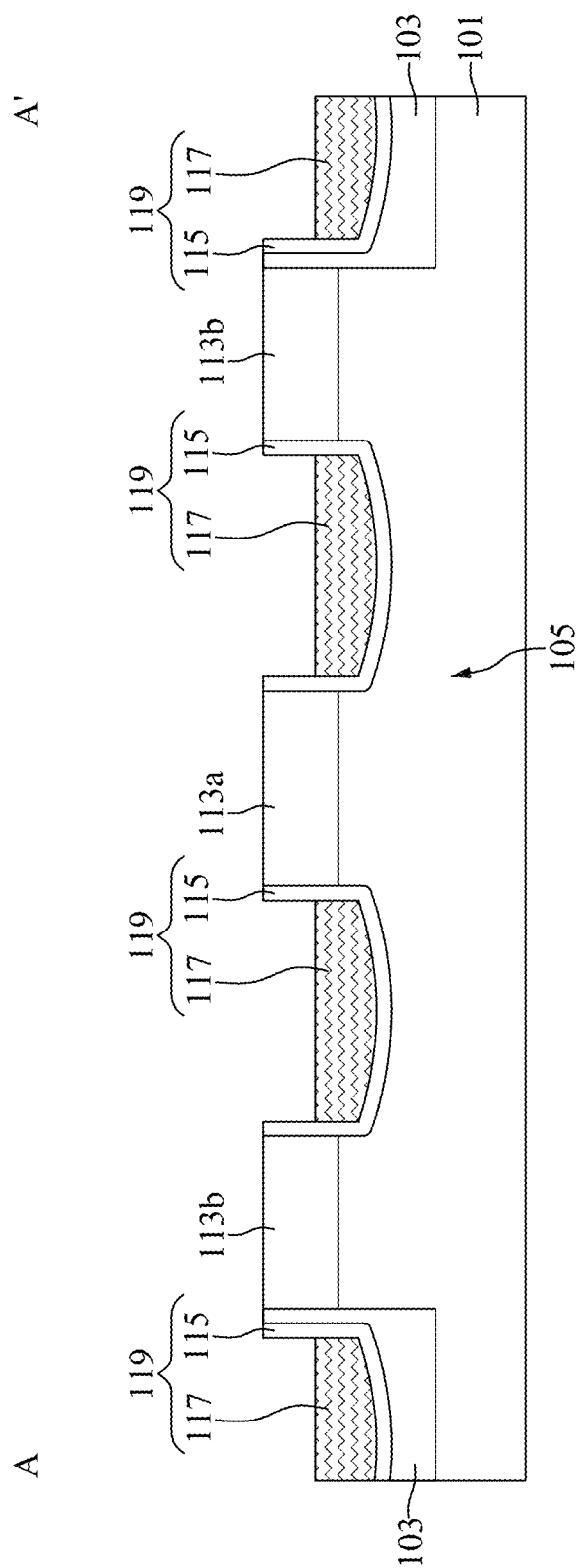
FIG. 13 is a cross-sectional view illustrating an intermediate stage in the formation of the memory device along the sectional line A-A' in FIG. 12, in accordance with some embodiments.

Next, the word lines 119 (i.e., the gate structures) are formed in the trenches 110, as shown in FIGS. 12 and 13 in accordance with some embodiments. The respective step is illustrated as the step S15 in the method 10 shown in FIG. 7. In some embodiments, the word lines 119 include the gate dielectric layers 115 and the gate electrodes 117.

In some embodiments, the gate dielectric layers 115 are made of silicon oxide, silicon nitride, silicon oxynitride, a dielectric material with high dielectric constant (high-k), or a combination thereof, and the gate electrodes 117 are made of a conductive material such as aluminum (Al), copper (Cu), tungsten (W), titanium (Ti), tantalum (Ta), or may be a multi-layer structure including any combination of the above materials. In some embodiments, barrier layers (not shown) are formed between the gate dielectric layers 115 and the gate electrodes 117.

The formation of the gate dielectric layers 115 may include conformally depositing a gate dielectric material (not shown) over the inner surfaces of the trenches 110 and the top surface of the semiconductor substrate 101, and planarizing the gate dielectric material to expose the top surface of the semiconductor substrate 101. After the gate dielectric layers 115 are formed, the formation of the gate electrodes 117 may include depositing a gate electrode material (not shown) over the gate dielectric layers 115, and recessing the gate electrode material to form the gate electrodes 117.

The deposition process of the gate dielectric material may include a chemical vapor deposition (CVD) process, a physical vapor deposition (PVD) process, an atomic layer deposition (ALD) process, a spin-coating process, or another applicable process. The planarization process of the gate dielectric material may be a chemical mechanical polishing (CMP) process. The deposition processes of the gate electrode material may include one or more deposition processes, such as a CVD process, a PVD process, an ALD process, a plasma enhanced chemical vapor deposition (PECVD) process, a metal organic chemical vapor deposition (MOCVD) process, a plating process, a sputtering process or another applicable deposition process. The gate electrode material may be recessed through an etch-back process, such that the top surfaces of the gate electrodes 117 are lower than the top surface of the semiconductor substrate 101. The etch-back process may include a wet etching process, a dry etching process, or a combination thereof.

Figure 14:
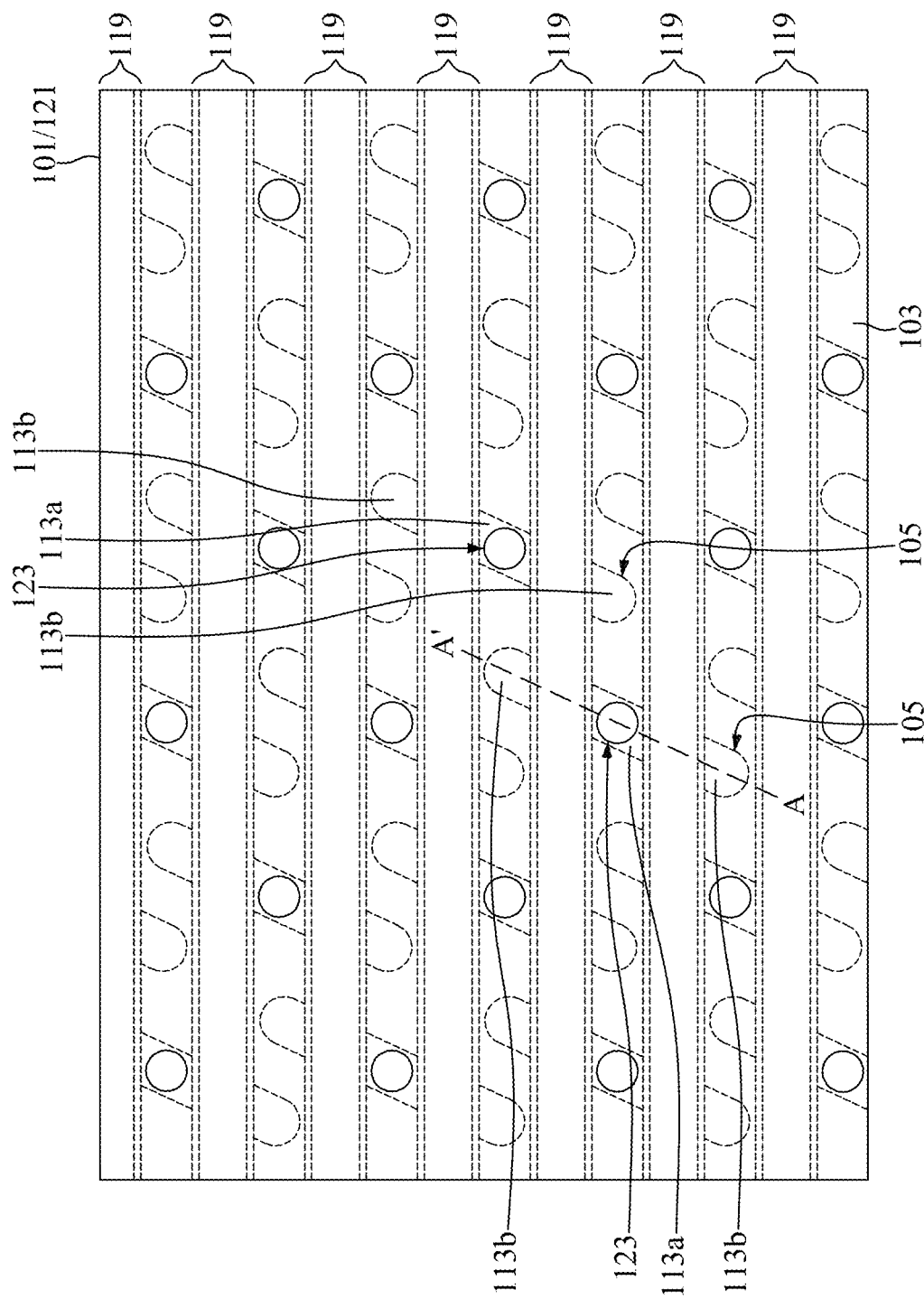
FIG. 14 is a top view illustrating an intermediate stage of forming a dielectric cap layer over the word lines during the formation of the memory device, in accordance with some embodiments.
Figure 15:
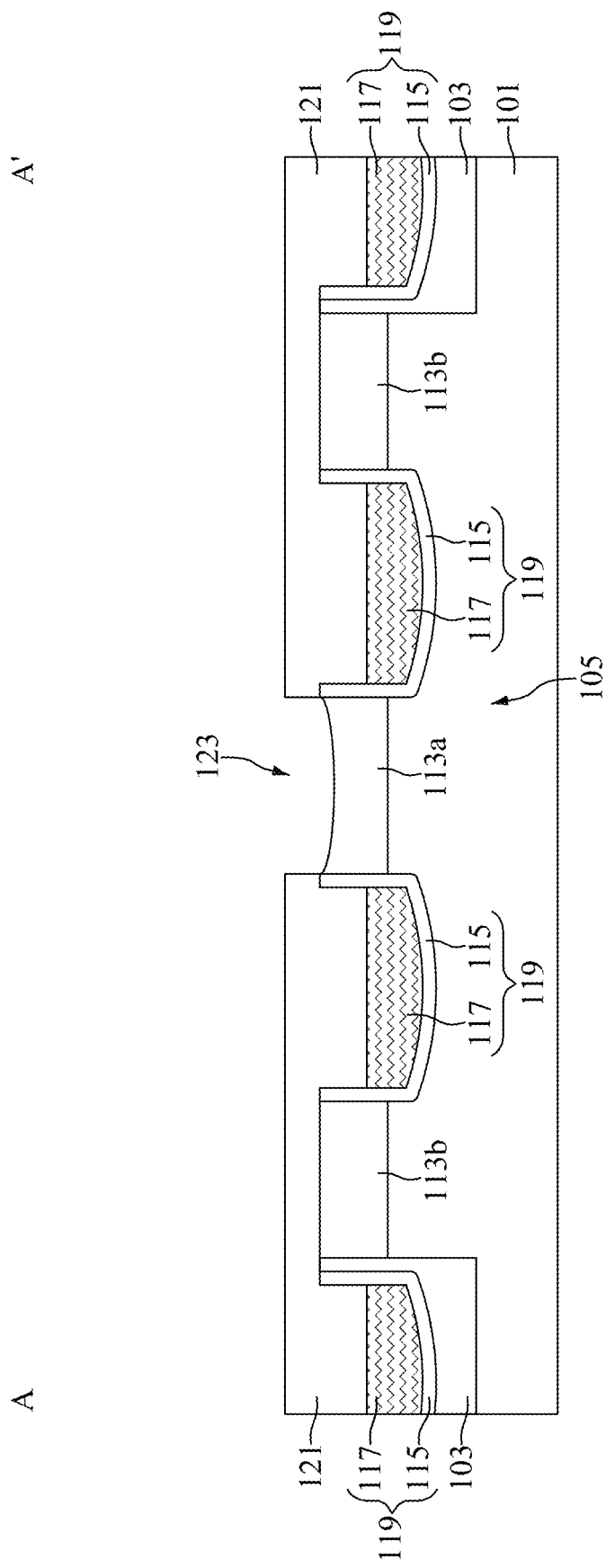
FIG. 15 is a cross-sectional view illustrating an intermediate stage in the formation of the memory device along the sectional line A-A' in FIG. 14, in accordance with some embodiments.

Subsequently, the dielectric cap layer 121 is formed covering the word lines 119, and the dielectric cap layer 121 is partially removed to form openings 123 exposing the source/drain regions 113a, as shown in FIGS. 14 and 15 in accordance with some embodiments. In some embodiments, portions of the dielectric cap layer 121 are surrounded by the gate dielectric layers 115. In some embodiments, the dielectric cap layer 121 is made of silicon oxide, silicon nitride, silicon oxynitride, or another applicable dielectric material.

In some embodiments, the dielectric cap layer 121 is formed by a CVD process, a PVD process, a spin coating process, another applicable process, or a combination thereof. In some embodiments, the openings 123 penetrating through the dielectric cap layer 121 are bit line openings. The formation of the openings 123 may include forming a patterned mask (not shown) over the dielectric cap layer 121, and etching the dielectric cap layer 121 by using the patterned mask as a mask. The etching process may be a wet etching process, a dry etching process, and a combination thereof. In some embodiments, portions of the source/drain regions 113a exposed by the patterned mask is removed by the etching process. After the openings 123 are formed, the pattered mask may be removed.

Figure 16:
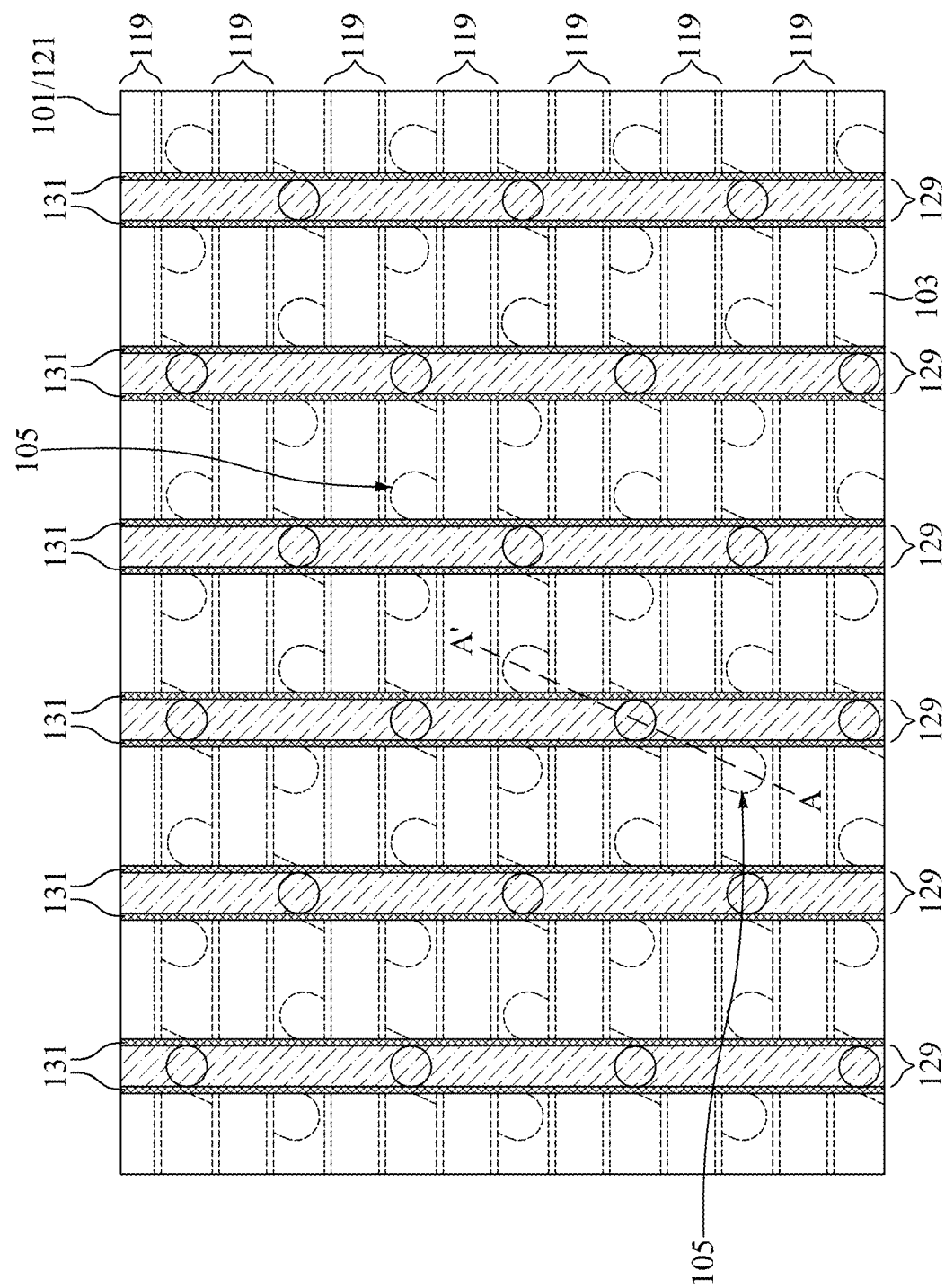
FIG. 16 is a top view illustrating an intermediate stage of forming bit lines over the dielectric cap layer during the formation of the memory device, in accordance with some embodiments.
Figure 17:
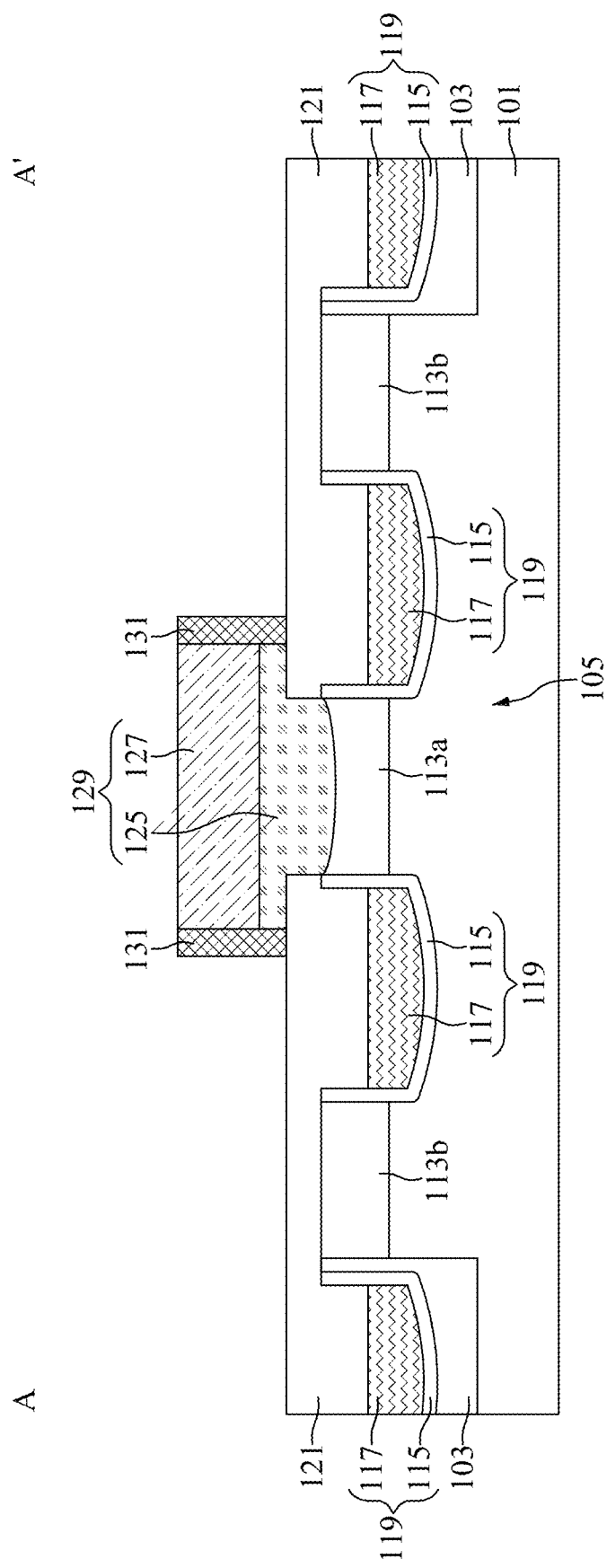
FIG. 17 is a cross-sectional view illustrating an intermediate stage in the formation of the memory device along the sectional line A-A' in FIG. 16, in accordance with some embodiments.

After the dielectric cap layer 121 is partially removed, the bit lines 129 are formed over the dielectric cap layer 121, and the openings 123 are filled by the bit lines 129, as shown in FIGS. 16 and 17 in accordance with some embodiments. The respective step is illustrated as the step S17 in the method 10 shown in FIG. 7. In some embodiments, the bit lines 129 are electrically connected to the source/drain regions 113a.

In some embodiments, the bit lines 129 include the lower bit line layers 125 and the upper bit line layers 127, and the openings 123 are filled by portions of the lower bit line layers 125. The formation of the bit lines 129 may include forming a lower bit line material (not shown) over the dielectric cap layer 121 and filling the openings 123, forming an upper bit line material (not shown) over the lower bit line material, forming a patterned mask (not shown) over the upper bit line material, and etching the upper bit line material and the lower bit line material by using the patterned mask as a mask. In some embodiments, the remaining portions of the lower bit line material (i.e., the lower bit line layers 125) and the remaining portions of the upper bit line material (i.e., the upper bit line layers 127) have aligned sidewalls. After the bit lines 129 are formed, the pattered mask may be removed.

Then, a plurality of dielectric spacers 131 are formed on the sidewalls of the bit lines 129, as shown in FIGS. 16 and 17 in accordance with some embodiments. In some embodiments, the dielectric spacers 131 are made of a doped spin-on-glass (SOG) material, such as phosphosilicate glass (PSG), borophosphosilicate glass (BPSG). In some embodiments, the dielectric spacers 131 are formed by a spin coating process, and a subsequent planarization process, such as a CMP process. The planarization process may be performed to expose the top surfaces of the bit lines 129.

Figure 18:
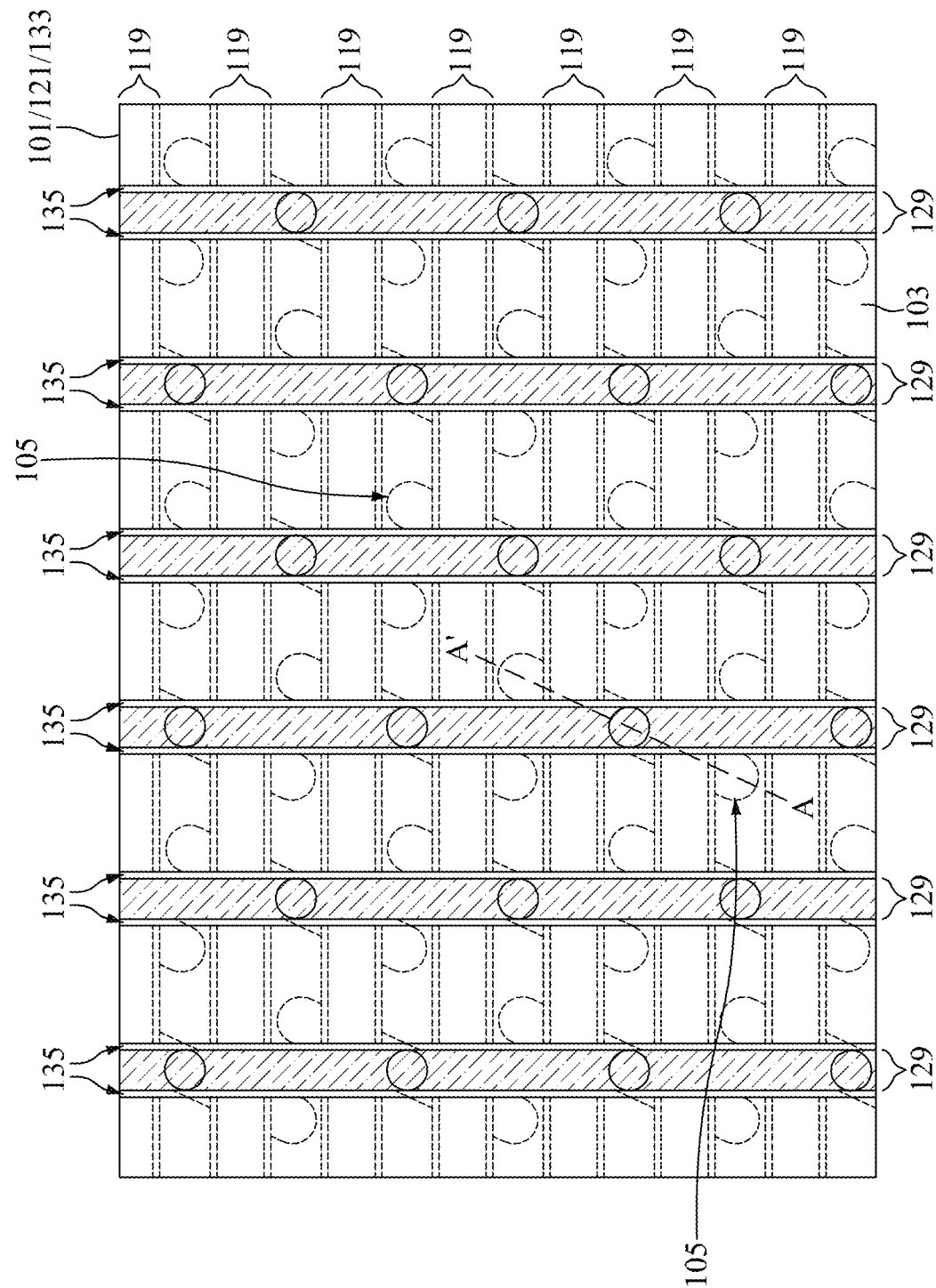
FIG. 18 is a top view illustrating an intermediate stage of forming air gaps on sidewalls of the bit lines during the formation of the memory device, in accordance with some embodiments.
Figure 19:
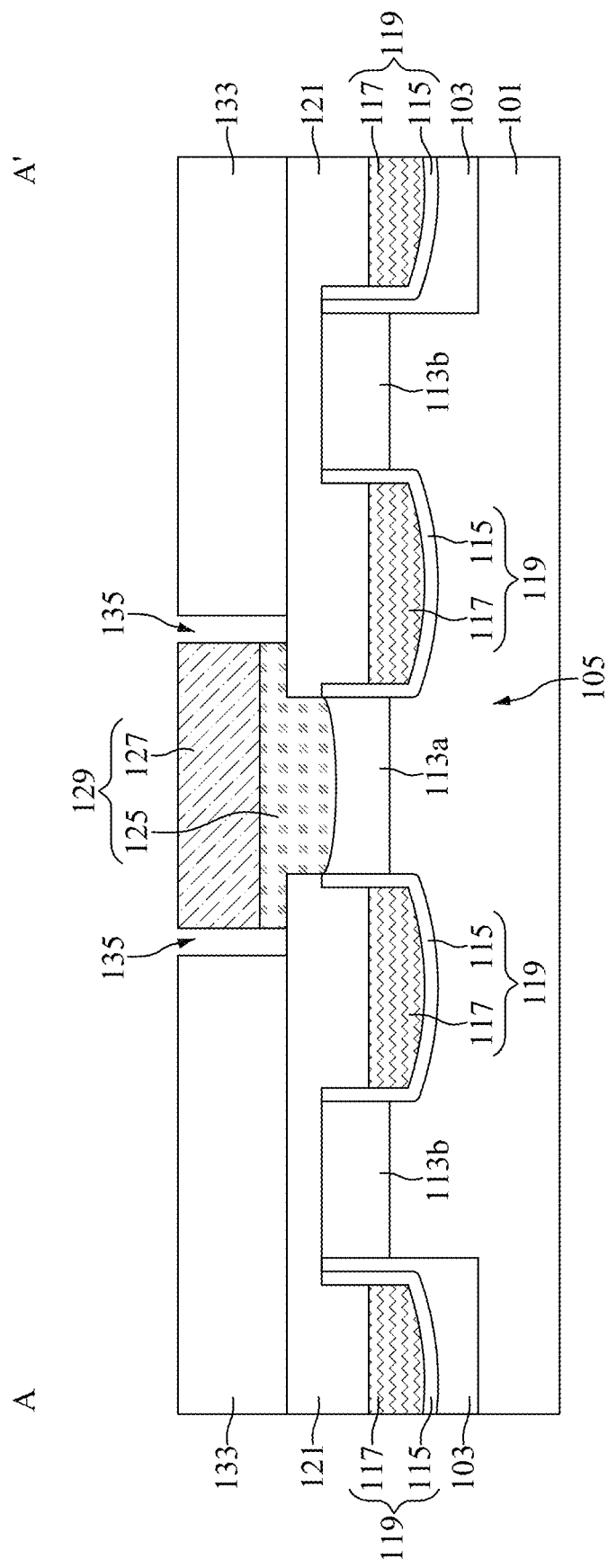
FIG. 19 is a cross-sectional view illustrating an intermediate stage in the formation of the memory device along the sectional line A-A' in FIG. 18, in accordance with some embodiments.

Next, the dielectric layer 133 is formed surrounding the dielectric spacers 131, and the dielectric spacers 131 are removed to form the air gaps 135 between the bit lines 129 and the dielectric layer 133, as shown in FIGS. 18 and 19 in accordance with some embodiments. In other words, the air gaps 135 are formed on the sidewalls of the bit lines 129, and the bit lines 129 are separated from the dielectric layer 133 by the air gaps 135, in accordance with some embodiments. The respective step is illustrated as the step S19 in the method 10 shown in FIG. 7.

In some embodiments, the dielectric layer 133 are made of low-k dielectric materials. In some embodiments, the low-k dielectric materials have a dielectric constant (k value) less than about 4. Examples of the low-k dielectric materials include, but not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bisbenzocyclobutenes (BCB), or polyimide.

In some embodiments, the dielectric layer 133 are formed by a deposition process and a subsequent planarization process. The deposition process may include a CVD process, a PVD process, a spin coating process, or another applicable process. The planarization process may include a grinding process, a CMP process, an etching process, another applicable process, or a combination thereof. After the planarization process, the top surface of the dielectric layer 133 is coplanar with the top surfaces of the bit lines 129 and the top surfaces of the dielectric spacers 131.

In some embodiments, the dielectric spacers 131 are removed by a vapor phase hydrofluoric acid (VHF) etching process after the dielectric layer 133 is formed. During the etching process, VHF is used as an etchant, and the dielectric spacers 131 have a high selectivity against the dielectric layer 133. Therefore, the dielectric spacers 131 are removed by the etching process, while the dielectric layer 133 may be substantially left, such that the air gaps 135 are obtained.

Figure 20:
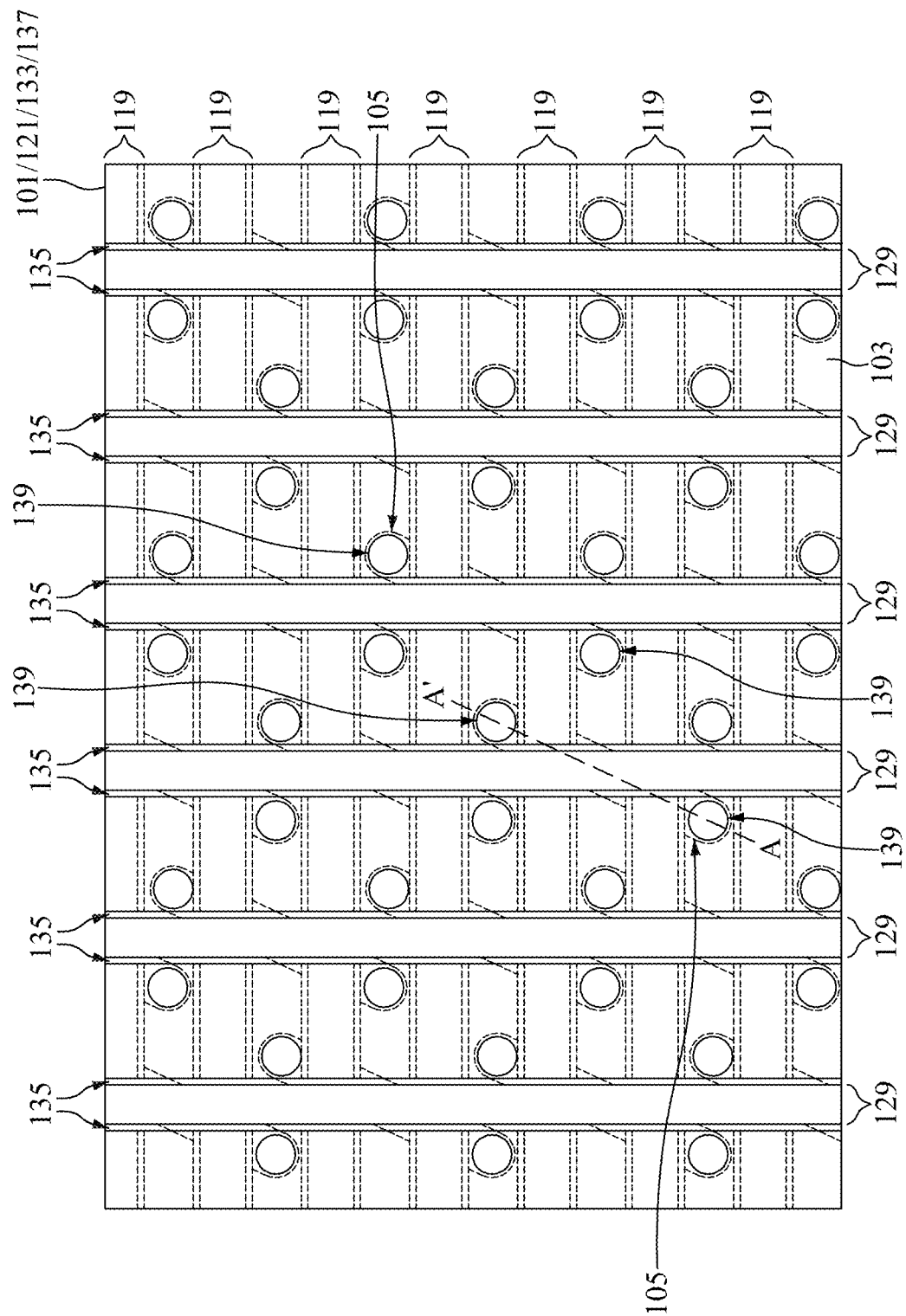
FIG. 20 is a top view illustrating an intermediate stage of forming a dielectric layer covering the bit lines and the air gaps during the formation of the memory device, in accordance with some embodiments.
Figure 21:
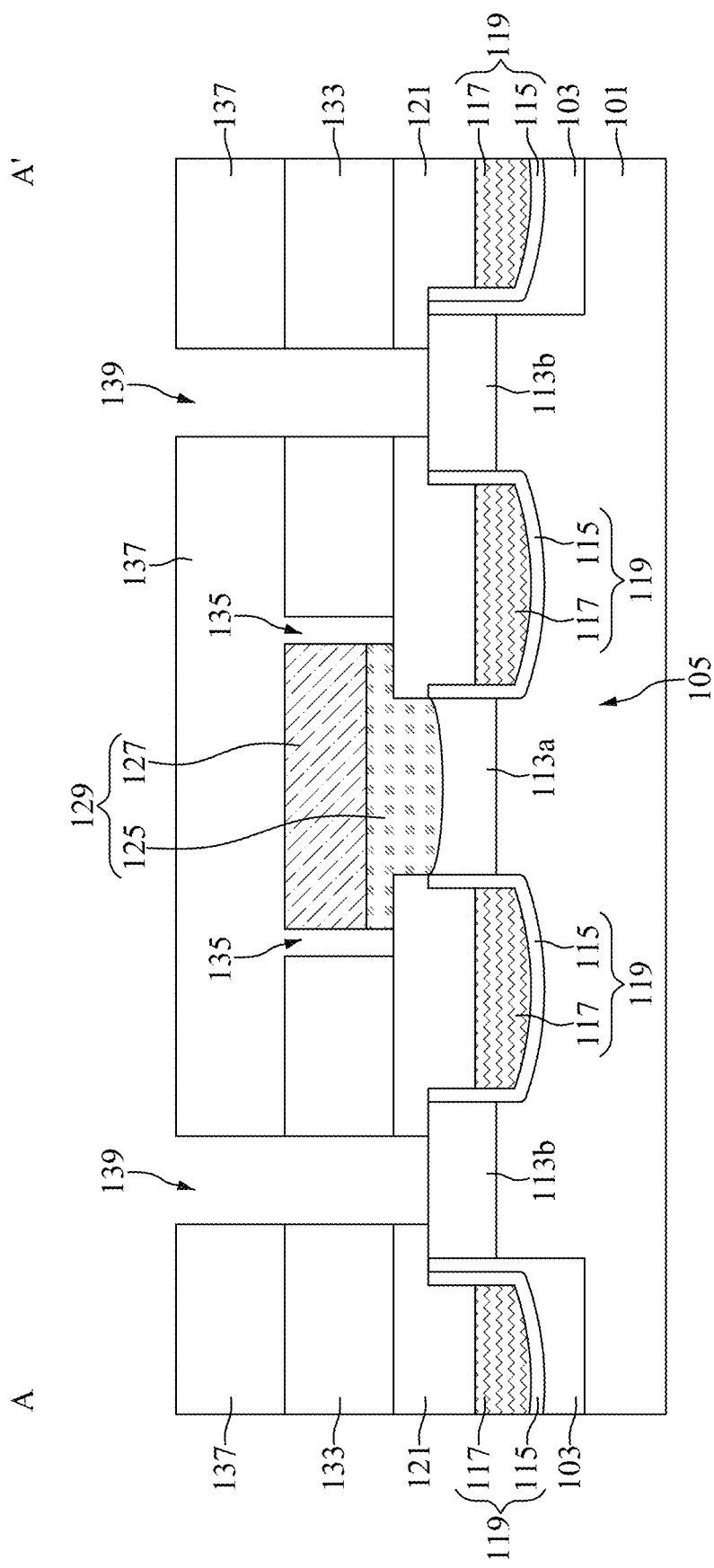
FIG. 21 is a cross-sectional view illustrating an intermediate stage in the formation of the memory device along the sectional line A-A' in FIG. 20, in accordance with some embodiments.

Subsequently, the dielectric layer 137 is formed over the dielectric layer 133 to seal the air gaps 135, and the dielectric cap layer 121 and the dielectric layers 133, 137 are partially removed to form openings 139 exposing the source/drain regions 113b, as shown in FIGS. 20 and 21 in accordance with some embodiments. Some materials and processes used to form the dielectric layer 137 are similar to, or the same as those used to form the dielectric layer 133, and details thereof are not repeated herein.

In some embodiments, the dielectric layer 137 is formed by a spin coating process, and the air gaps 135 with high aspect ratios are sealed by the dielectric layer 137 with the air gaps 135 remain therein rather than filled up by the dielectric layer 137. In some embodiments, the dielectric layer 137 extends into a top portion of the air gaps 135, such that a top surface of the air gaps 135 is lower than a top surface of the bit lines 129.

In some embodiments, the openings 139 penetrating through the dielectric cap layer 121 and the dielectric layers 133, 137 are capacitor contact openings. The formation of the openings 139 may include forming a patterned mask (not shown) over the dielectric layer 137, and etching the dielectric layer 137 by using the patterned mask as a mask. The etching process may be a wet etching process, a dry etching process, and a combination thereof. After the openings 139 are formed, the pattered mask may be removed.

After the openings 139 are formed, the conductive contacts 141 are formed in the openings 139, and a dielectric layer 143 is formed over the dielectric layer 137 to cover the conductive contacts 141, as shown in FIGS. 22 to 24 in accordance with some embodiments. In some embodiments, the conductive contacts are capacitor contacts, which electrically connect the source/drain regions 113b between the bit lines 129 to the subsequently formed capacitors. The respective step is illustrated as the step S21 in the method 10 shown in FIG. 7.

In some embodiments, the conductive contacts 141 are made of a conductive material, such as copper (Cu), tungsten (W), aluminum (Al), titanium (Ti), tantalum (Ta), gold (Au), silver (Ag). The conductive contacts 141 may be formed by a deposition process and a subsequent planarization process. The deposition process may include a CVD process, a PVD process, a sputtering process, a plating process, or another applicable process. The planarization process may be a CMP process. Some materials and processes used to form the dielectric layer 143 are similar to, or the same as those used to form the dielectric layer 133, and details thereof are not repeated herein.

Still referring to FIGS. 22 to 24, a first group of openings 145a and a second group of openings 145b are formed penetrating through the dielectric layer 143 to expose the conductive contacts 141, in accordance with some embodiments. In some embodiments, the sizes of the openings 145a are substantially the same, and the sizes of the openings 145b are substantially the same. In some embodiments, the first group of openings 145a and the second group of openings 145b have different sizes. Specifically, each of the openings 145a has a width W1 along the longitudinal axis of the active regions 105 as shown in FIG. 23, and each of the openings 145b has a width W2 along the longitudinal axis of the active regions 105 as shown in FIG. 24. In some embodiments, the width W2 is greater than the width W1.

The formation of the openings 145a and 145b may include forming a patterned mask (not shown) over the dielectric layer 143, and etching the dielectric layer 143 by using the patterned mask as a mask to expose the conductive contacts 141. The etching process may be a wet etching process, a dry etching process, and a combination thereof. After the openings 145a and 145b are formed, the pattered mask may be removed.

Next, referring back to FIGS. 1 to 3, the first group of capacitors 157a are formed in the first group of openings 145a in the dielectric layer 143, and the second group of capacitors 157b are formed in the second group of openings 145*b* in the dielectric layer 143, in accordance with some embodiments. The respective step is illustrated as the step S23 in the method 10 shown in FIG. 7. It should be noted that the sizes of the capacitors 157*a* are different from the sizes of the capacitors 157*b*, in accordance with some embodiments.

As mentioned above, the first group of capacitors 157*a* include the conductive layers 151*a* and 155*a*, and the dielectric layers 153*a* disposed between the conductive layers 151*a* and 155*a*. The second group of capacitors 157*b* include the conductive layers 151*b* and 155*b*, and the dielectric layers 153*b* disposed between the conductive layers 151*b* and 155*b*. In some embodiments, the conductive layers 151*a* and 151*b* include titanium nitride (TiN), the dielectric layers 153*a* and 153*b* include a dielectric material, such as silicon dioxide ($SiO_2$), hafnium dioxide ($HfO_2$), aluminum oxide ($Al_2O_3$), zirconium dioxide ($ZrO_2$), or a combination thereof, and the conductive layers 155*a* and 155*b* include titanium nitride (TiN), low-stress silicon-germanium (SiGe), or a combination thereof.

In some embodiments, the dielectric layers 153*a* of the first group of capacitors 157*a* include a material that is different from a material of the dielectric layers 153*b* of the second group of capacitors 157*b*. For example, the dielectric layers 153*a* are made of silicon dioxide ($SiO_2$), and the dielectric layers 253*b* are made of hafnium dioxide ($HfO_2$). After the capacitors 157*a* and 157*b* are formed, the memory device 100 is obtained.

Embodiments of the memory devices 100 and 200 are provided in the disclosure. In some embodiments, each of the memory devices 100 and 200 includes a first group of capacitors and a second group of capacitors disposed over and electrically connected to the source/drain regions in different active regions, and the first group of capacitors and the second group of capacitors have different features. For example, in the memory device 100, the first group of capacitors 157*a* and the second group of capacitors 157*b* have different sizes. Moreover, in the memory device 200, the dielectric layers 253*a* of the first group of capacitors 257*a* and the dielectric layers 253*b* of the second group of capacitors 257*b* include different materials. Therefore, multiple levels of storage capacities may be obtained. As a result, the overall device performance may be improved.

In one embodiment of the present disclosure, a memory device is provided. The memory device includes a semiconductor substrate having a first active region and a second active region adjacent to the first active region. The memory device also includes a first word line extending across the first active region and the second active region. The memory device further includes a first source/drain region in the first active region and a second source/drain region in the second active region disposed at opposite sides of the first word line. In addition, the memory device includes a first capacitor disposed over and electrically connected to the first source/drain region in the first active region, and a second capacitor disposed over and electrically connected to the second source/drain region in the second active region. The first capacitor and the second capacitor have different sizes.

In another embodiment of the present disclosure, a memory device is provided. The memory device includes a semiconductor substrate having a first active region and a second active region adjacent to the first active region. The memory device also includes a first word line extending across the first active region and the second active region. The memory device further includes a first source/drain region in the first active region and a second source/drain region in the second active region disposed at opposite sides of the first word line. In addition, the memory device includes a first capacitor disposed over and electrically connected to the first source/drain region in the first active region, and a second capacitor disposed over and electrically connected to the second source/drain region in the second active region. The first capacitor and the second capacitor include different dielectric materials.

In yet another embodiment of the present disclosure, a memory device is provided. The memory device includes a semiconductor substrate having a first active region and a second active region adjacent to the first active region. The memory device also includes a first word line extending across the first active region and the second active region, and a second word line extending across the first active region but not across the second active region. The memory device further includes a first source/drain region disposed in the first active region, a second source/drain region disposed in the second active region, and a third source/drain region disposed in the first active region. The first source/drain region and the second source/drain region are disposed at opposite sides of the first word line, and the second source/drain region and the third source/drain region are disposed at opposite sides of the second word line. In addition, the memory device includes a first capacitor disposed over and electrically connected to the first source/drain region in the first active region, a second capacitor disposed over and electrically connected to the second source/drain region in the second active region, and a third capacitor disposed over and electrically connected to the third source/drain region in the first active region. A size of the first capacitor is substantially the same as a size of the third capacitor, and the size of the first capacitor is different from a size of the second capacitor.

The embodiments of the present disclosure have some advantageous features. By combining different types of capacitors in the memory device (e.g., capacitors with different sizes and/or different dielectric materials), multiple levels of storage capacities may be obtained. As a result, the overall device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:
1. A memory device, comprising:
a semiconductor substrate having a first active region and a second active region adjacent to the first active region; wherein the first active region includes a first source/drain region, and the second active region includes a second source/drain region;
a first word line extending across both of the first active region and the second active region; wherein the first source/drain region in the first active region and the second source/drain region in the second active region disposed at opposite sides of the first word line, wherein the first source/drain region and the second source/drain region are separated by the first word line;
a first capacitor disposed over and electrically connected to the first source/drain region in the first active region; and
a second capacitor disposed over and electrically connected to the second source/drain region in the second active region, wherein the first capacitor in the first active region and the second capacitor in the second active region, both of which are extended across by the first word line, have different sizes.

2. The memory device of claim 1, wherein the first capacitor and the second capacitor have different widths along a longitudinal axis of the first active region.

3. The memory device of claim 1, wherein a first dielectric layer in the first capacitor and a second dielectric layer in the second capacitor are made of different materials.

4. The memory device of claim 1, further comprising:
a third capacitor disposed above and electrically connected to a third source/drain region in the first active region; and
a fourth capacitor disposed above and electrically connected to a fourth source/drain region in the second active region, wherein the third capacitor and the fourth capacitor have different sizes.

5. The memory device of claim 1, further comprising:
a first bit line disposed over and electrically connected to a fifth source/drain region in the first active region; and
a second bit line disposed over and electrically connected to a sixth source/drain region in the second active region.

6. The memory device of claim 5, wherein the first source/drain region in the first active region and the second source drain region in the second active region are disposed between the first bit line and the second bit line.

7. The memory device of claim 5, further comprising:
a conductive contact disposed between the first capacitor and the first source/drain region, wherein the first bit line and the conductive contact have an air gap therebetween.

8. A memory device, comprising:
a semiconductor substrate having a first active region and a second active region adjacent to the first active region; wherein the first active region includes a first source/drain region, and the second active region includes a second source/drain region;
a first word line extending across both of the first active region and the second active region; wherein the first source/drain region in the first active region and the second source/drain region in the second active region disposed at opposite sides of the first word line, wherein the first source/drain region and the second source/drain region are separated by the first word line;
a first capacitor disposed over and electrically connected to the first source/drain region in the first active region; and
a second capacitor disposed over and electrically connected to the second source/drain region in the second active region, wherein the first capacitor in the first active region and the second capacitor in the second active region, both of which are extended across by the first word line, comprise different dielectric materials.

9. The memory device of claim 8, wherein the first capacitor comprises a first dielectric layer sandwiched between a first conductive layer and a second conductive layer, the second capacitor comprises a second dielectric layer sandwiched between a third conductive layer and a fourth conductive layer, and wherein the first dielectric layer and the second dielectric layer are made of different materials.

10. The memory device of claim 8, wherein a footprint of the first capacitor is smaller than a footprint of the second capacitor.

11. The memory device of claim 8, further comprising:
a third capacitor disposed over and electrically connected to a third source/drain region in the first active region; and
a fourth capacitor disposed over and electrically connected to a fourth source/drain region in the second active region, wherein the third capacitor and the fourth capacitor comprise different dielectric materials.

12. The memory device of claim 11, wherein a footprint of the third capacitor is smaller than a footprint of the fourth capacitor.

13. The memory device of claim 8, further comprising:
a second word line extending across the first active region but not across the second active region;
a third word line extending across the second active region but not across the first active region, wherein the first word line is disposed between the second word line and the third word line;
a first bit line disposed above and electrically connected to a fifth source/drain region in the first active region between the first word line and the second word line; and
a second bit line disposed above and electrically connected to a sixth source/drain region in the second active region between the first word line and the third word line.

14. The memory device of claim 13, further comprising:
a dielectric layer disposed over the semiconductor substrate, wherein the first bit line and the second bit line are disposed in the dielectric layer, and the first bit line and the second bit line are separated from the dielectric layer by air gaps.

15. A memory device, comprising:
a semiconductor substrate having a first active region and a second active region adjacent to the first active region; wherein the first active region includes a first source/drain region and a third source/drain region, and the second active region includes a second source/drain region;
a first word line extending across both of the first active region and the second active region; wherein the first source/drain region in the first active region and the second source/drain region in the second active region disposed at opposite sides of the first word line, wherein the first source/drain region and the second source/drain region are separated by the first word line;
a second word line extending across the first active region but not across the second active region; wherein the second source/drain region and the third source/drain region are disposed at opposite sides of the second word line,
a first capacitor disposed over and electrically connected to the first source/drain region in the first active region;

a second capacitor disposed over and electrically connected to the second source/drain region in the second active region; and a third capacitor disposed over and electrically connected to the third source/drain region in the first active region, wherein a size of the first capacitor is substantially the same as a size of the third capacitor, and the first capacitor in the first active region and the second capacitor in the second active region, both of which are extended across by the first word line, have different sizes.

16. The memory device of claim 15, wherein a bottom surface of the second capacitor is greater than a bottom surface of the first capacitor.

17. The memory device of claim 15, wherein the first capacitor comprises a first dielectric layer sandwiched between a first conductive layer and a second conductive layer, the second capacitor comprises a second dielectric layer sandwiched between a third conductive layer and a fourth conductive layer, and wherein the first dielectric layer and the second dielectric layer are made of different materials.

18. The memory device of claim 17, wherein the third capacitor comprises a third dielectric layer sandwiched between a fifth conductive layer and a sixth conductive layer, wherein the third dielectric layer is made of a same material as the first dielectric layer of the first capacitor.

19. The memory device of claim 15, further comprising:
a third word line extending across the second active region but not across the first active region;
a fourth source/drain region disposed in the second active region, wherein the first source/drain region and the fourth source/drain region are disposed at opposite sides of the third word line; and
a fourth capacitor disposed over and electrically connected to the fourth source/drain region in the second active region, wherein a size of the fourth capacitor is substantially the same as the size of the second capacitor.

20. The memory device of claim 19, further comprising:
a fifth source/drain region disposed in the first active region and between the first word line and the second word line;
a sixth source/drain region disposed in the second active region and between the first word line and the third word line;
a first bit line electrically connected to the fifth source/drain region; and
a second bit line electrically connected to the sixth source/drain region.

* * * * *